United States Patent
Tilton

(10) Patent No.: US 7,104,078 B2
(45) Date of Patent: Sep. 12, 2006

(54) SPRAY COOLING SYSTEM FOR TRANSVERSE THIN-FILM EVAPORATIVE SPRAY COOLING

(75) Inventor: Charles L. Tilton, Colton, WA (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 209 days.

(21) Appl. No.: 10/913,299

(22) Filed: Aug. 5, 2004

(65) Prior Publication Data

US 2006/0026970 A1    Feb. 9, 2006

(51) Int. Cl.
*F28C 1/00* (2006.01)
(52) U.S. Cl. ......................... 62/121; 62/171
(58) Field of Classification Search ................ 62/121, 62/171, 259.2, 305, 309, 310, 434; 261/78.1
See application file for complete search history.

(56) References Cited

U.S. PATENT DOCUMENTS

| | | | | |
|---|---|---|---|---|
| 2,906,103 A | * | 9/1959 | Saltzman ..................... | 62/231 |
| 5,349,831 A | * | 9/1994 | Daikoku et al. .............. | 62/376 |
| 5,907,473 A | | 5/1999 | Przilas et al. | |
| 6,108,201 A | * | 8/2000 | Tilton et al. ................ | 361/689 |
| 6,139,361 A | * | 10/2000 | Przilas et al. ............... | 439/559 |
| 6,292,364 B1 | * | 9/2001 | Fitzgerald et al. .......... | 361/699 |
| 6,349,554 B1 | * | 2/2002 | Patel et al. ................. | 62/259.2 |
| 6,498,725 B1 | * | 12/2002 | Cole et al. .................. | 361/700 |
| 6,571,569 B1 | * | 6/2003 | Rini et al. .................. | 62/259.2 |
| 6,817,196 B1 | * | 11/2004 | Malone et al. ............... | 62/171 |
| 6,955,062 B1 | * | 10/2005 | Tilton et al. ................ | 62/259.2 |
| 6,955,063 B1 | * | 10/2005 | Adiga et al. ................ | 62/259.2 |
| 6,971,441 B1 | * | 12/2005 | Lee ......................... | 165/104.22 |
| 7,013,662 B1 | * | 3/2006 | Tilton et al. ................ | 62/259.2 |
| 2003/0164231 A1 | | 9/2003 | Goodson et al. | |

FOREIGN PATENT DOCUMENTS

JP          11-148733 A  *  6/1999

* cited by examiner

*Primary Examiner*—Mohammad M. Ali
(74) *Attorney, Agent, or Firm*—Wells St. John P.S.

(57) ABSTRACT

A spray cooling system for transverse evaporative spray cooling in a narrow gap which may generally include a mixing zone, a converging zone, a cooling conduit, and a re-circulation conduit. The spray cooling system in some of its embodiments, provides among other things, a feed system for narrow gap evaporative spray cooling, a method for reducing the pressure gradient across the surface from which heat is to be transferred and a housing system which utilizes a baffle to separate the cooling conduit from a re-circulation conduit and to re-circulate vapor to the entry of the cooling conduit.

26 Claims, 16 Drawing Sheets

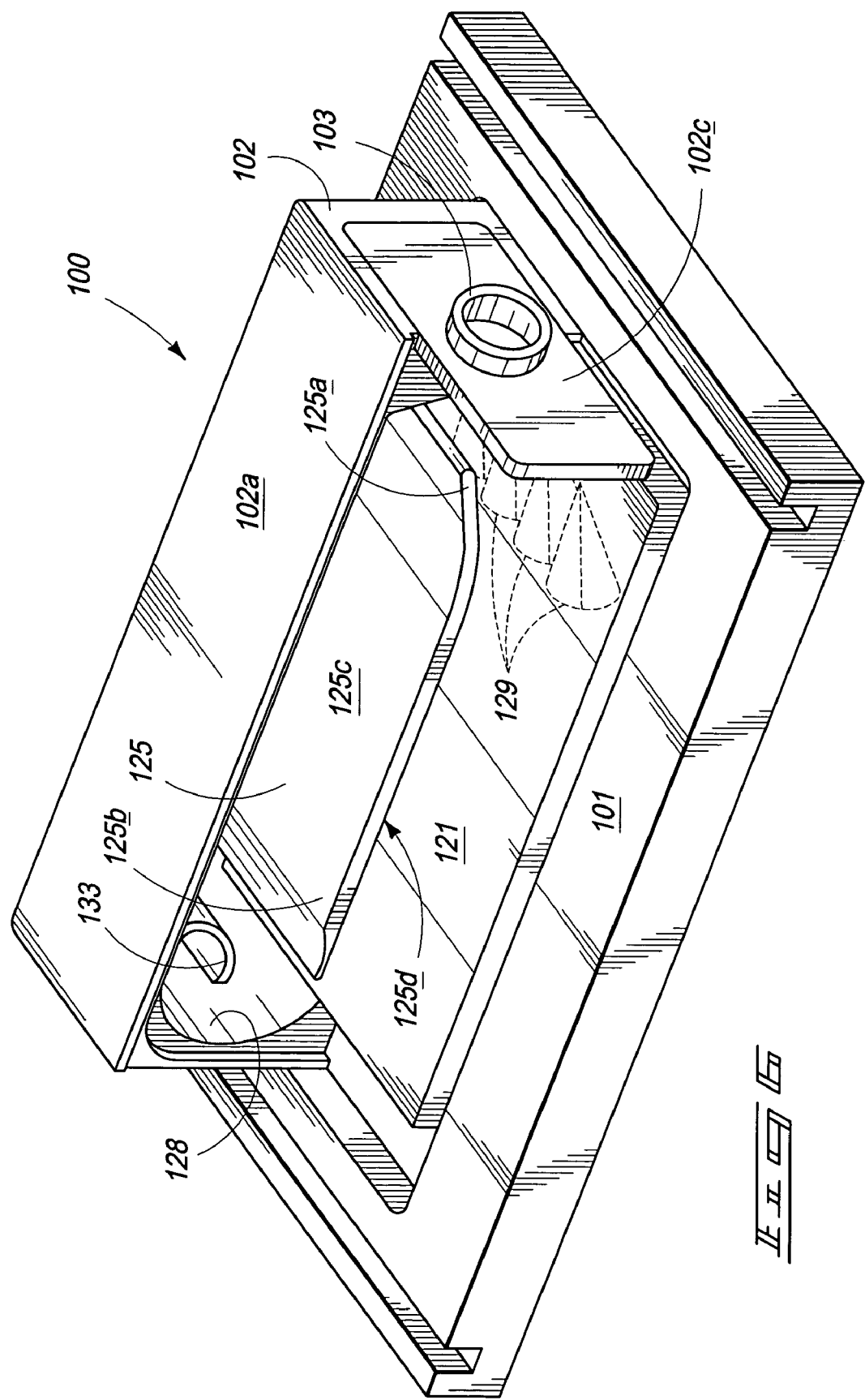

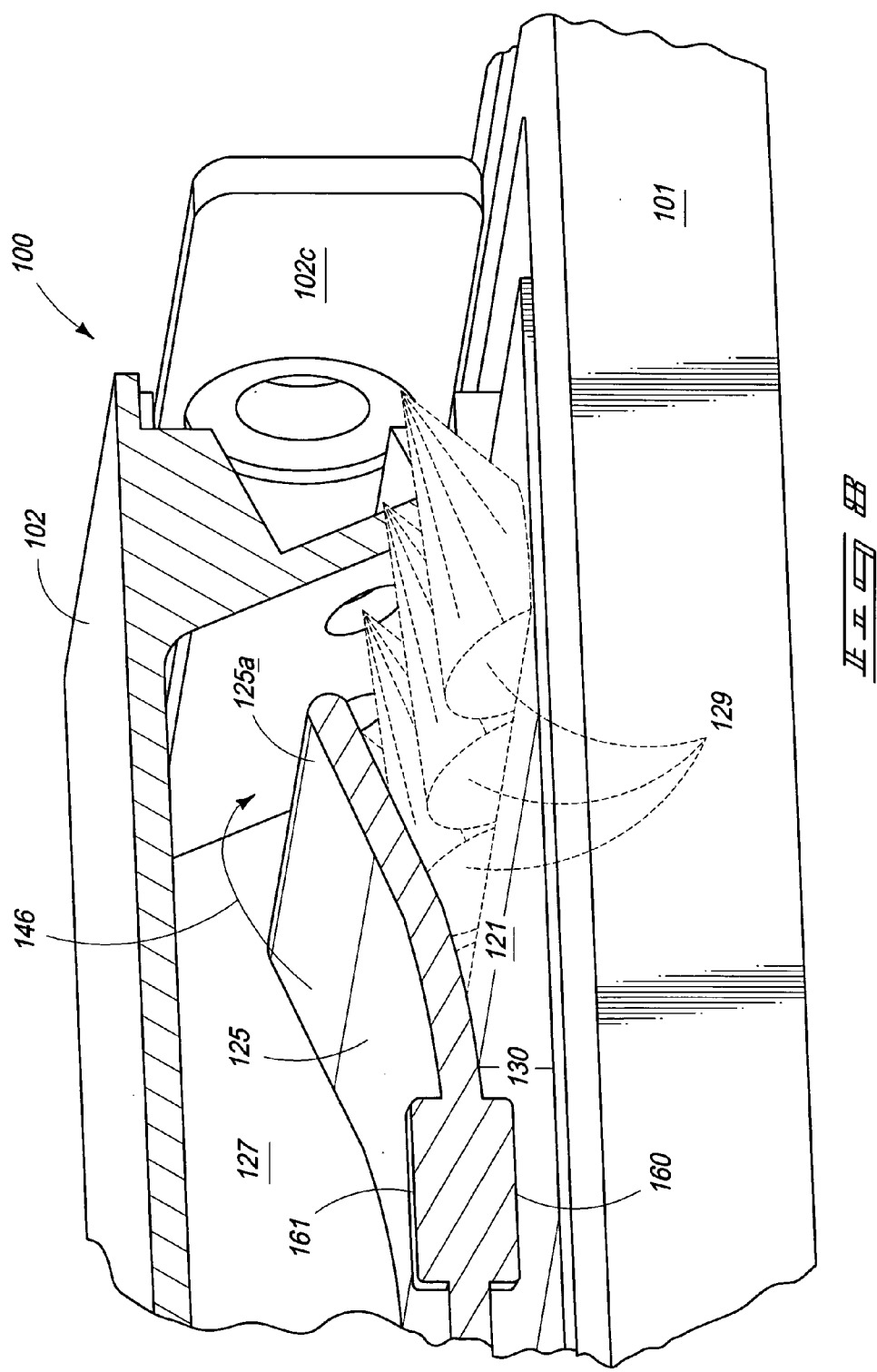

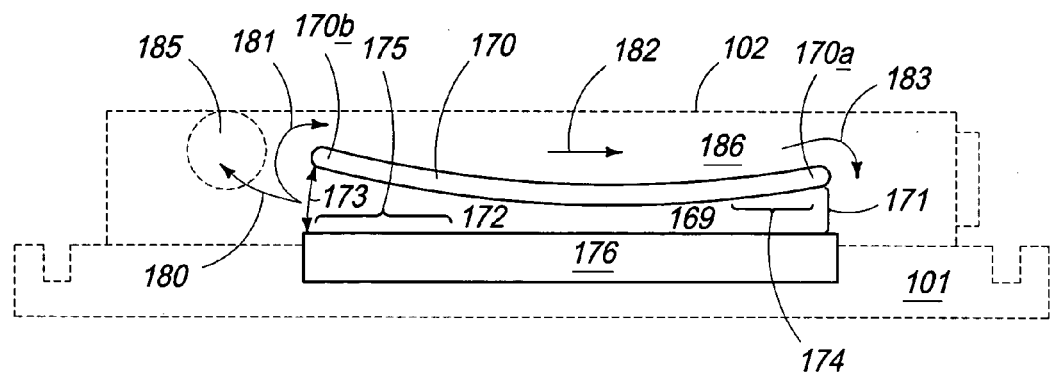
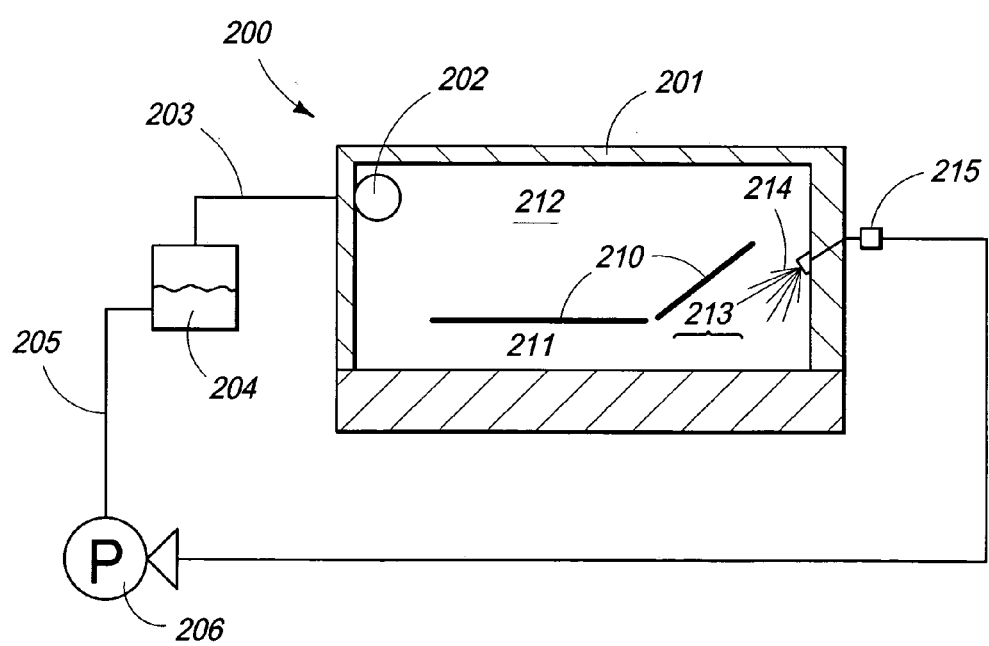

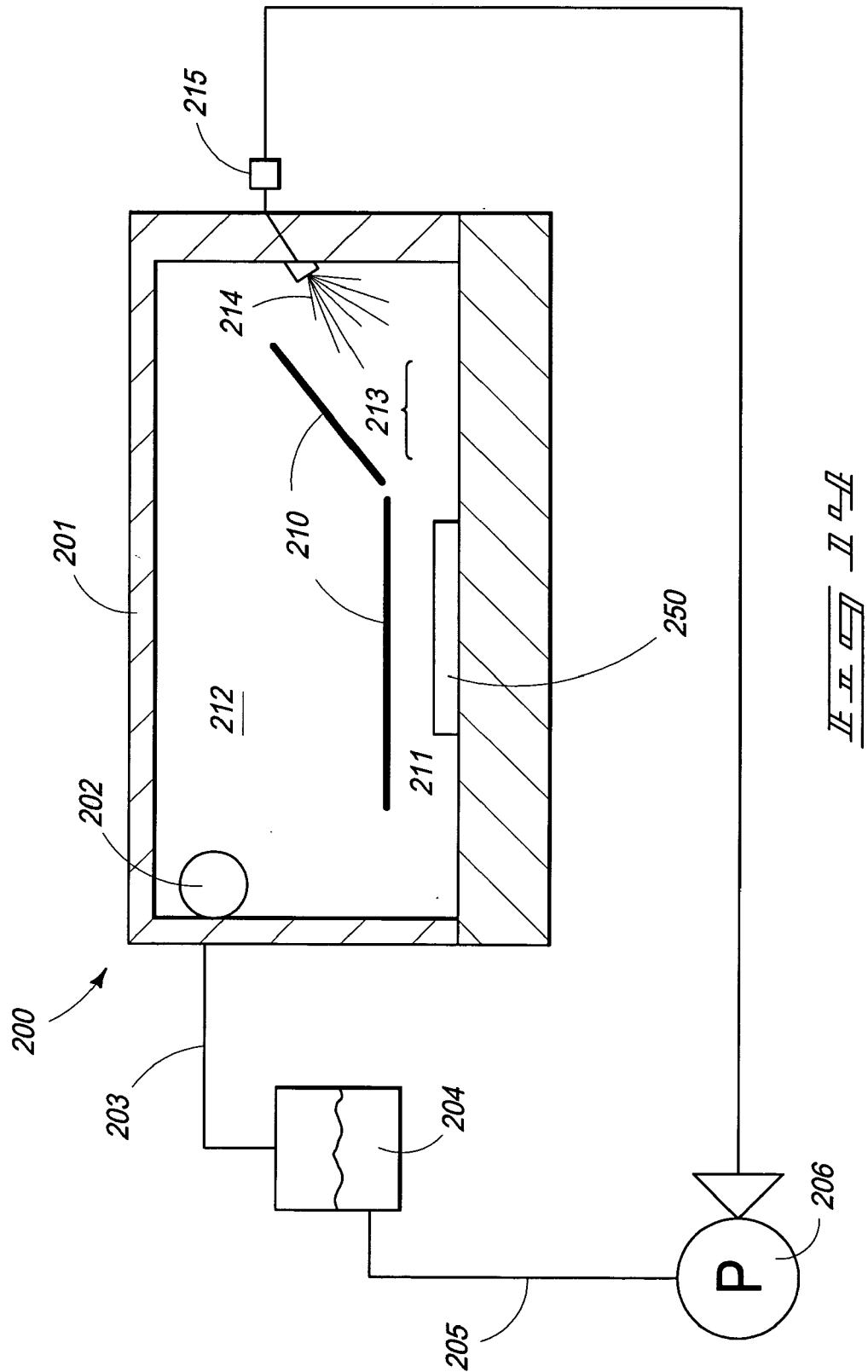

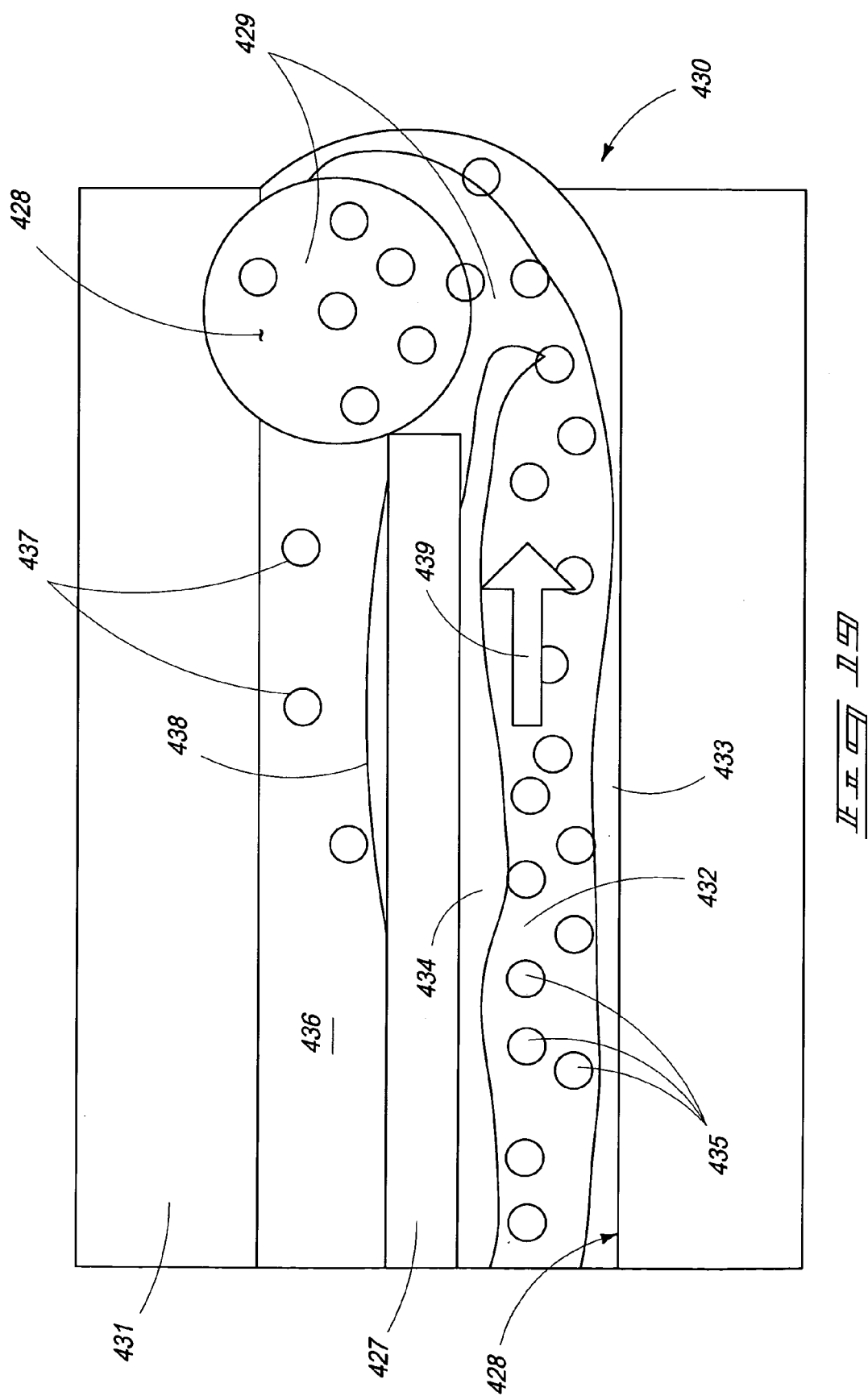

SPRAY COOLING SYSTEM FOR TRANSVERSE THIN-FILM EVAPORATIVE SPRAY COOLING

TECHNICAL FIELD

This invention relates to an evaporative spray cooling system for transverse evaporative thin-film spray cooling of electronic components.

BACKGROUND OF THE INVENTION

As electronic components continue to advance and are made more powerful, they tend to produce more and more undesirable heat which is preferably removed. This has created a growing need for higher capacity cooling systems to remove heat from all or a portion of the electronic components.

As the trend is to make electronic components more powerful, there is also an increasing push to reduce the size of the electronic components, and the packaging of the electronic components. The smaller components and packaging makes the removal of the unwanted heat more difficult.

In some applications, direct impingement thin-film evaporative spray cooling is preferred in order to provide sufficient cooling, whereas in other applications spray cooling is desired to reduce the overall package or housing size even though the required cooling capability is not as high. This creates a situation in which transverse narrow gap evaporative spray cooling is advantageous if it can be done to an acceptable efficiency level.

Narrow gap evaporative spray cooling will preferably provide or spray the coolant from a transverse side of the surface to be cooled (or the surface from which heat is to be transferred). Proper cooling is preferably achieved if a thin liquid film is maintained over the device or electronic component to be cooled, thereby facilitating evaporation of the coolant as heat is transferred from the electronic component. If there is too little flow or coverage of coolant, the liquid layer covering the electronic component will dry out and cause the component to overheat because vapor forced convection will not typically provide sufficient heat transfer. If the flow of coolant to the component is too great, the device will become flooded and may produce hot spots, insufficient cooling and/or failure, because the vapor created from the evaporation may become trapped between the excessive fluid and the impingement surface of the electronic component. This will normally reduce the cooling efficiency. Vapor generated at the surface of the component which receives too much coolant cannot escape effectively and could result in a boiling heat transfer failure mode generally referred to as burnout.

Even when the volume flux of coolant is properly matched to the heat flux of the device, the excess fluid sprayed within a cavity must generally be managed by the method described in U.S. Pat. No. 5,220,804 to prevent the overflow from adjacent components from interfering and causing flooding type failure conditions.

It is therefore an objective of some embodiments of this invention to provide a narrow gap, thin-film, evaporative spray cooling system for cooling one or more electronic components in the narrow gap.

It is also an objective of some embodiments of this invention to provide a narrow gap evaporative spray cooling system which improves the cooling characteristics of the system, especially at the entry end of the cooling channel or conduit, and/or reduces the pressure gradient above the surface from which heat is to be transferred.

It is also an objective of some embodiments of this invention to provide a housing system which provides improved re-circulation of the vapor for re-introduction of the vapor into the cooling conduit.

It is an objective of some embodiments of this invention to provide a re-circulation system which reduces pooling of the liquid portion of the coolant at or near the exit end of the cooling conduit.

BRIEF DESCRIPTION OF THE DRAWINGS

Preferred embodiments of the invention are described below with reference to the following accompanying drawings.

FIG. 6 is a front perspective partial cut-away view of the embodiment of the invention illustrated in FIG. 1;

FIG. 7 is an elevation cross-section of the embodiment of the invention illustrated in FIG. 1;

FIG. 8 is an elevation detail cut-away view of the entrance end of the cooling conduit and the spray coolant being sprayed therein, of the embodiment of the invention illustrated in FIG. 1, only with exemplary fins added to the baffle;

FIG. 9 is a side elevation view of an alternative baffle configuration wherein the cross-sectional area at or near the exit end of the cooling conduit is increased;

FIG. 10 is a side schematic representation of an embodiment of this invention, showing an alternative configuration relative to the surface from which heat is to be transferred, schematically illustrating a bare die or direct contact embodiment;

FIG. 12 is a side schematic representation of an embodiment of this invention, showing an alternative configuration relative to the surface from which heat is to be transferred, schematically illustrating a cold plate embodiment;

FIG. 13 is a side schematic representation of an embodiment of this invention, showing an alternative configuration relative to the surface from which heat is to be transferred, schematically illustrating a cold plate configuration with a cold plate embodiment which includes a different surface roughness or configuration;

FIG. 14 is a side schematic representation of an embodiment of this invention, showing an alternative configuration relative to the surface from which heat is to be transferred, schematically illustrating a direct contact embodiment;

FIG. 18 is a chart or table showing a heat transfer comparison; and

FIG. 19 is a schematic illustration of an embodiment of a re-circulation separator which may be utilized by this invention.

DETAILED DESCRIPTION OF THE PREFERRED EMBODIMENTS

Figure 1:
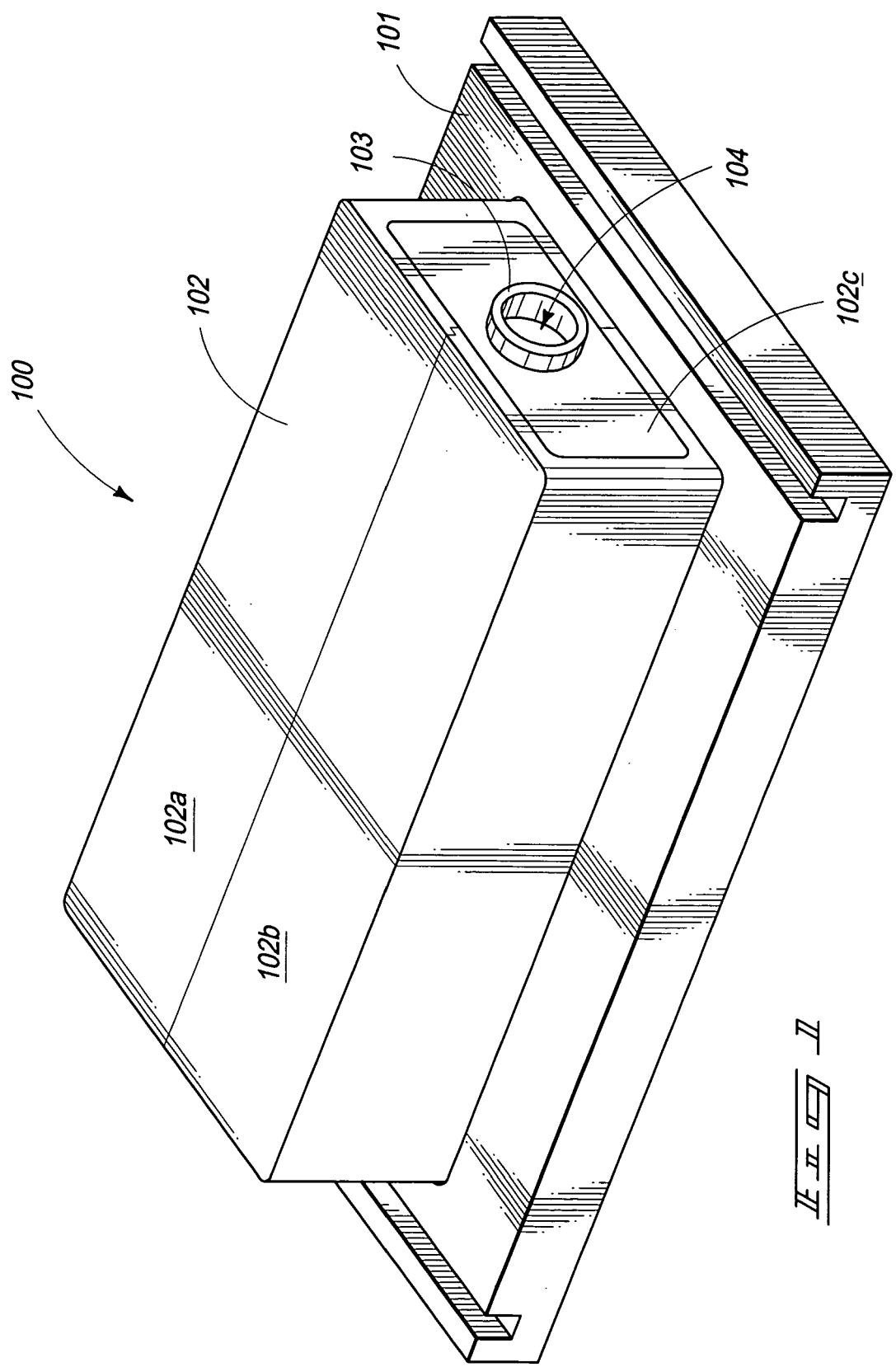
FIG. 1 is a front perspective view of one embodiment of the invention.

Many of the fastening, connection, manufacturing and other means and components utilized in this invention are widely known and used in the field of the invention described, and their exact nature or type is not necessary for an understanding and use of the invention by a person skilled in the art or science; therefore, they will not be discussed in significant detail. Furthermore, the various components shown or described herein for any specific application of this invention can be varied or altered as anticipated by this invention and the practice of a specific application or embodiment of any element may already be widely known or used in the art or by persons skilled in the art or science; therefore, each will not be discussed in significant detail.

The terms "a", "an", and "the" as used in the claims herein are used in conformance with long-standing claim drafting practice and not in a limiting way. Unless specifically set forth herein, the terms "a", "an", and "the" are not limited to one of such elements, but instead mean "at least one".

Applicant hereby refers to and incorporates by this reference the following U.S. patents: U.S. Pat. No. 5,675,473 issued Oct. 7, 1997; U.S. Pat. No. 5,220,804 for a high heat flux evaporative spray cooling system; and U.S. Pat. No. 5,860,602 and U.S. Pat. No. 6,016,969, each for a laminated array of pressure swirl atomizers. The laminated array of pressure swirl atomizer patents referred to above may be utilized as one way or mechanism to accomplish the atomizing, even though there are numerous others which are available and now known in the art, such as button atomizers and others; such as U.S. patent application Ser. No. 10/292,073, for an Integrated Circuit Heat Dissipation System, dated Nov. 12, 2002, which is also incorporated herein by this reference.

In prior designs, thin film spray modules have experienced flow non-uniformities that are preferred to be minimized or eliminated, especially in the first few centimeters of the narrow gap-cooling channel or cooling conduit. Further, in some applications, the atomizers spraying into a narrow gap cooling channel in many configurations tend to create or do create an adverse pressure gradient that may result in flow reversals. Flow reversals may result in pooling on or near the surface from which heat is to be transferred. Pooling of the coolant generally reduces the heat transfer capability of the system (as compared to the maintenance of a thin film evaporation condition), and may cause the overheating and/or failure of the electronics being directly or indirectly cooled.

Many or most prior designs rely on atomizer designs that produced wide and narrow sprays which were complimentary to the channel dimensions, and utilized atomizer spacings that emphasized heavily overlapping sprays. While these configurations work in ideal operating and design conditions, they also may result in spray striking the walls of the conduits or channels near the entry, which dissipates the spray momentum and results in reduced cooling, among other things.

These prior systems also heavily rely on the generation of coolant vapor in the cooling process in order to maintain the thin film necessary for the desired heat transfer from the surface from which heat is to be transferred. In closed commercial applications of thin film evaporative spray cooling, particularly in a narrow gap application, the momentum of the atomized spray is very difficult to rely upon to achieve or maintain the thin film, and as a practical matter, it should not be relied upon in most applications. Instead it has been found that sufficient vapor entrainment may be more reliable in maintaining the desired thin film, especially if it is at relatively higher velocities.

As the velocity of the vapor increases, there is an increasing need or desire to re-circulate at least a portion of the vapor to the entry of the cooling conduit. Since coolant vapor, and coolant vapor at a relatively high velocity appears to achieve a better cooling result, re-circulating at least a portion of the vapor at the entrance to the cooling conduit allows it to be utilized to maintain an improved thin film at the entrance of the cooling chamber; instead of the prior reliance on the vaporization process at or near the entry to assist or improve the maintenance of a thin film further downstream. The prior systems which relied primarily on the evaporation process at or near the entrance to the cooling conduit to maintain the thin film did not maintain as desirable of a thin film at or near the entrance; which in turn results in a heat transfer gradient from the entrance side to the exit side of the surface from which heat is to be transferred.

Embodiments of an improved system such as this invention may also utilize one aspect of this invention which provides an improved re-circulation mechanism for re-circulating the vapor with less liquid phase coolant included in that re-circulation. If an undesirably high amount of coolant in the liquid phase is re-circulated and introduced at the entrance end of the cooling conduit, it tends to negatively impact the desired quality and composition of the input to the cooling conduit. Excess liquid may also impinge the spray or spray pattern of the atomized coolant which is introduced to the entrance side of the coolant conduit.

This invention addresses the improvement of narrow gap evaporative spray cooling at multiple locations in the system, and each may be used individually or in combination with one or more of the other elements or aspects of this invention. More particularly, this invention provides an improved method of vapor entrainment at the entrance end, an improved vapor/liquid separation for the re-circulation of the vapor, and another aspect may provide additional evaporation of the vapor in the evaporation conduit, utilizing heat transferred in the coolant conduit.

The aspect of this invention which improves the vapor entrainment addresses the exponential decay of the velocity of the spray droplets caused by aerodynamic drag. The drag tends to pull the atomized droplets inward or away from the surface from which heat is to be extracted or removed. On the other hand the velocity of the entrained "vapor" increases exponentially with the distance traveled from the entrance to the exit, and at some point downstream, the velocity of the vapor may or will equal the velocity of the liquid or droplets. After that point the velocities of the combination of the vapor and the spray droplets will decrease.

The most effective cooling or removal of heat from the surface to be cooled, will result from a more consistent and higher velocity through the cooling conduit. An aspect of this invention utilizes the "capturing" of the combined flow of spray and vapor and at a desired or at an optimum location, as shown in FIG. 18, and as more fully discussed below.

While this aspect of the invention may utilize any one of a number of different types of spray nozzles or atomizers providing atomized coolant droplets in any one of a number of patterns or configurations, it has been found that a more circular spray pattern achieves more desired results even though prior spray patterns for narrow gap evaporative spray cooling has typically been a wider flat spray. It will be appreciated by those of ordinary skill in the art that known button type atomizers will work well in this application. The discussion below with regard to FIG. 6 among others illustrates this.

One embodiment of this invention utilizes a mixing zone to collect and accelerate the mixture of the atomized spray coolant and the re-circulated vapor into the inlet or entrance to the cooling conduit. The mixing zone may also be referred to as a vapor entrainment zone. The flow is generally confined upon entry into the cooling conduit. This aspect or embodiment will also help reduce or avoid the "flood" that otherwise occurs in prior systems when the surface to be cooled is not hot (when for example the electronics are not powered up or at full heat) since the flow mixture is achieved before, at or near the entry or inlet to the coolant chamber. A flooded condition in prior devices may result in a failure of the electronics when they are then powered up since a flooded condition does not provide adequate heat transfer capability, thereby causing a thermal failure of the electronic component ultimately being cooled directly or indirectly by an embodiment of this invention. The flow may but need not be annular flow or dispersed annular flow through the cooling conduit or channel.

Embodiments of this invention may also include a spray collection and vapor acceleration zone wherein the cross-sectional area is reduced in size before the combination of the coolant spray droplets and the re-circulated vapor are introduced into the entrance end of the cooling conduit.

Prior pending and co-owned patent application Ser. No. 10/096,340, published on Sep. 18, 2003, illustrates narrow channel or gap cooling and various configurations which may be utilized, and is hereby incorporated herein as though fully set forth herein, by this reference and incorporation by reference. In general however, the cooling conduit may be of uniform, constant or varying cross section, with an objective of embodiments of this invention to move closer to a constant surface temperature across the surface from which heat is to be transferred (the elimination of temperature gradients either across the surface to be cooled or across the underlying electronic component—if it is in fact different.

However it will be appreciated by those of ordinary skill in the art that moving toward or achieving a constant surface temperature is dependent on multiple factors, including without limitation, the pressure drop or gradient from the entrance to the exit of the cooling conduit (change in evaporating temperature), the area (as the velocity affects the heat coefficient), the vapor/liquid ratio (film thickness) and the thermal characteristics of the base or surface from which heat is to be transferred (whether it is a bare or uncovered electronic chip or component, a lidded or packaged chip or whether it is the bottom plate of a "coldplate" solution). It will also be appreciated by those of ordinary skill in the art that other variables and components may or will affect the achievement of a constant surface temperature, such as the performance of the condenser, the manifolding of multiple spray modules, and others.

As referenced above, embodiments of this invention also include improvements at the exit end of the cooling conduit, such as an improved liquid/vapor phase separator, as discussed more fully below in reference to the figures.

In prior narrow gap cooling systems, the configurations have relied upon the tendency of the liquid phase to continue to travel in the same direction it travels through the cooling conduit, to prevent it from entering the re-circulation conduit, or at least to attempt to reduce the amount of liquid that does enter the re-circulation conduit. Since the vapor had a much lower inertia than the liquid, the re-circulation channel would be in a different direction to cause as much vapor as possible to be re-routed through that chamber while the liquid phase continued linearly for further processing.

It has been found however that a thinner liquid film has a sufficiently low inertia that it may also reverse its direction, resulting in an undesirable flow of the liquid phase into the re-circulation conduit. The velocity of the vapor may also tend to influence or pull the liquid phase in the same direction it is re-circulated.

In an embodiment of the invention, a re-circulation embodiment, the cross-section, two-dimensional area or three-dimensional area or volume, is increased to reduce the velocity of the vapor phase, thereby reducing its pull or influence on the liquid phase, which results in less liquid phase coolant passing into or through the re-circulation conduit. It will be appreciated by those of ordinary skill in the art that other means and mechanisms may be utilized to reduce the velocity of the vapor phase through separation from the liquid phase and into the re-circulation chamber, such as ribs, dividers, and porous capillary plugs, all within the contemplation of this invention.

Other embodiments of the separator and re-circulation aspect of this invention may be used individually or in combination with other aspects. For instance, one embodiment of the invention includes a baffle between the cooling conduit and the re-circulation conduit, with the re-circulation conduit being vertically above the cooling conduit. The baffle may utilize heat from fins, grooves or other surface heat transfer mechanisms, means or enhancers, or from the cooling conduit to facilitate or cause further evaporation of vapor and/or liquid phase moving through or located within the re-circulation conduit. This is shown in the figures and more fully described below in connection with the figures.

In some embodiments of the invention, the coolant supplied to the atomizer may be pre-heated or heated to higher temperatures than in traditional prior systems to better facilitate providing an increased amount or percentage of vapor at the inlet or entrance to the cooling conduit. It will further be appreciated by those of ordinary skill in the art that the coolant fluid can be any one of a number of different types of fluid, or that the fluid may be a blend of more than one different type of coolant fluid to achieve different fluid characteristics such as altering the boiling point, improved or more tailored thermal properties (such as thermal conductivity).

Turning to the figures, FIG. 1 is a front perspective view of one embodiment of the invention, showing a spray cooling system module 100 (also referred to as a "spray module"), with housing 102, first housing end 102c, and base 101. The base may or may not be considered part of the spray module, depending on the specific application and embodiment of the invention. Although not shown in FIG. 1, some applications of this invention which may involve differing bases or definitions of when a base is or is not included as part of the housing may include a surface from which heat is to be transferred which is the top of an integrated circuit chip, the top of a package for an integrated circuit chip, a cold plate or a heat spreader; and each of these may be configured with or without surface heat spreaders or other enhancements to alter the heat transfer characteristics at that surface.

FIG. 1 further illustrates housing 102 with a first housing side 102a and a second housing side 102b, coolant inlet 104 and coolant inlet coupling 103 around coolant inlet 104. Coupling 103 may be bonded or glued within the aperture in the housing 102 where it is located. As discussed below in more detail, the module housing 102 may be manufactured in one or more pieces and then interconnected during assembly, and assembled with a separate or integral first end 102c and second end (not shown in FIG. 1). The base 101 may be attached to the housing 102, or the housing 102 pieces together in any one of a number of ways, with no one in particular being required to practice this invention. For instance the housing 102 may be bonded or glued to the base 101. The housing 102 and other components shown in FIG. 1 may also be made out of a wide variety of materials, such as aluminum based materials and/or copper based materials or alloys.

Figure 2:
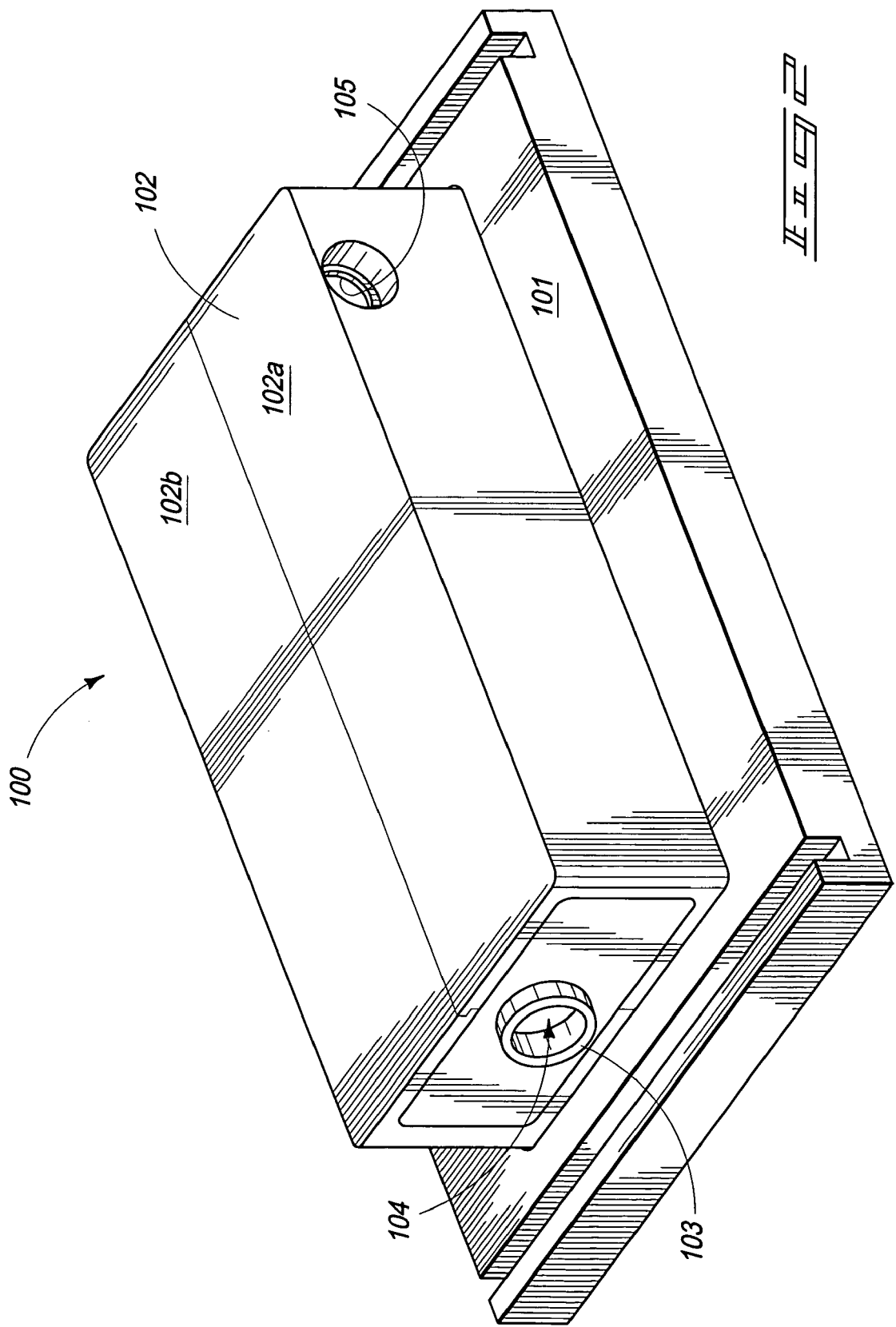
FIG. 2 is a rear perspective view of the embodiment of the invention illustrated in FIG. 1.

FIG. 2 is a rear perspective view of the embodiment of the invention illustrated in FIG. 1, illustrating spray module or spray cooling system module 100, base 101, housing 102 with a first housing side 102a and a second housing side 102b, coolant inlet 104, coolant inlet coupling 103 around coolant inlet 104, and coolant outlet 105 for routing coolant liquid and coolant vapor out of the module for re-processing or disposal. As is discussed in further detail below, it is preferred to route coolant in the liquid phase out of the module and a pre-determined amount of coolant in the vapor phase back through the re-circulation: conduit for re-introduction into the cooling conduit, wherein a liquid/vapor separator may be utilized, as set forth more fully below.

Figure 3:
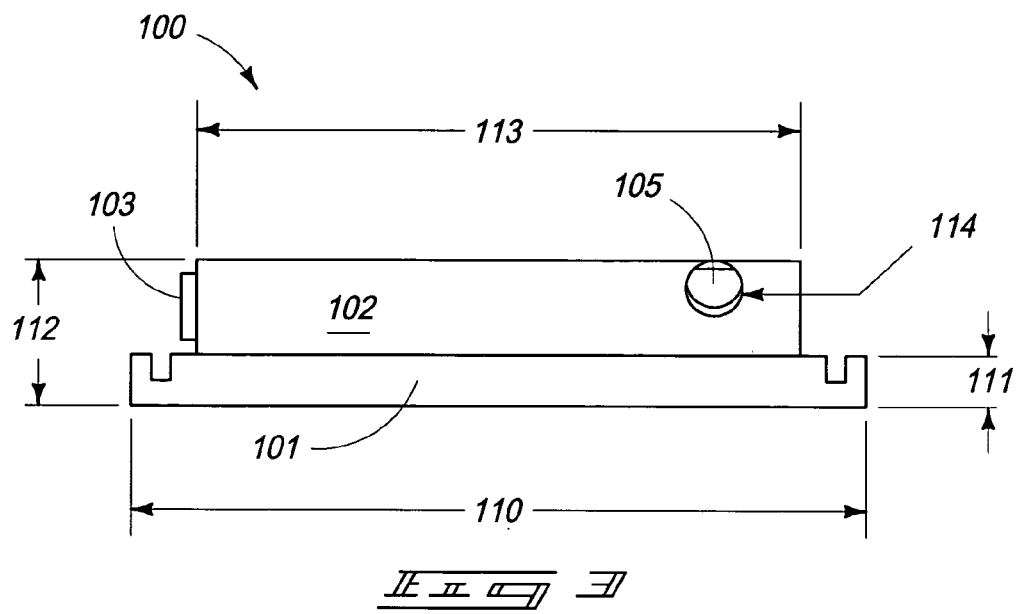
FIG. 3 is a rear side elevation view of the embodiment of the invention illustrated in FIG. 1.

FIG. 3 is a rear side elevation view of the embodiment of the invention illustrated in FIG. 1, illustrating spray module or spray cooling system module 100, base 101, housing 102, coolant inlet coupling 103 and coolant outlet 105. It will be appreciated by those of ordinary skill in the art that the specific dimensions of any given embodiment of the invention will vary based on the application; however in order to give one example of a scale, the following dimensions are given: dimension 113 may be two and three-quarter inches, dimension 112 may be seven-tenths of an inch, dimension 110 may be 3.51 inches, dimension 111 may be one-quarter of an inch, and with inlet radius 114 being 0.14 inches.

Figure 4:
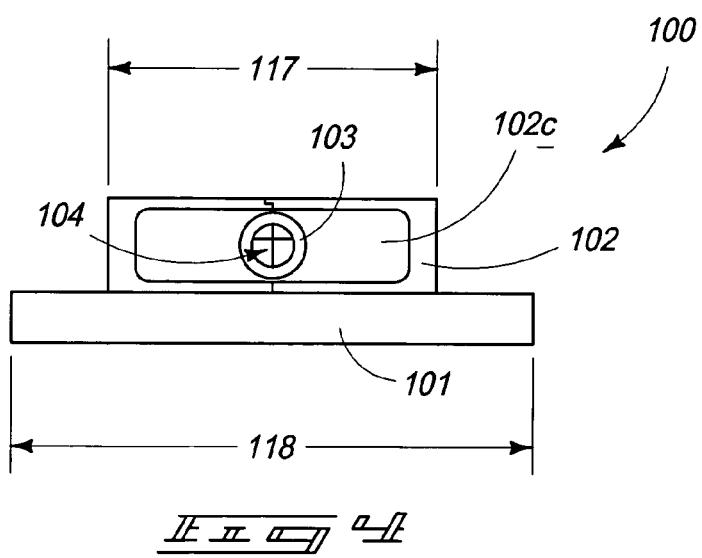
FIG. 4 is an end view of the embodiment of the invention illustrated in FIG. 1.

FIG. 4 is an end view of the embodiment of the invention illustrated in FIG. 1, illustrating spray module or spray cooling system module 100, base 101, housing 102, coolant inlet coupling 103, first housing end 102c, and coolant inlet 104. It will be appreciated by those of ordinary skill in the art that the specific dimensions of any given embodiment of the invention will vary based on the application; however in order to give one example of a scale and consistent with those given relative to FIG. 3, dimension 117 may be 1.57 inches and dimension 118 may be two and one-half inches.

Figure 5:
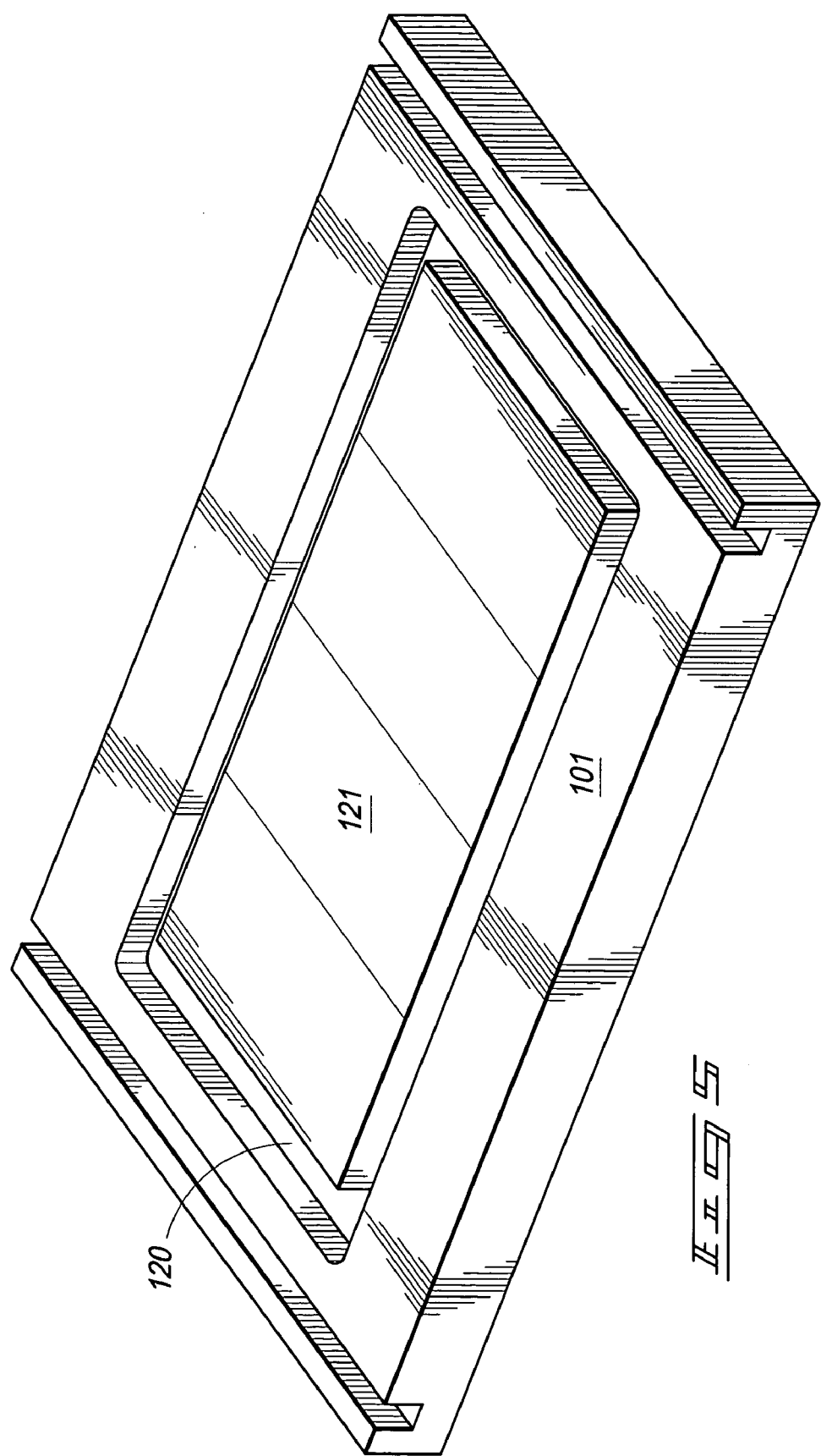
FIG. 5 is a front perspective view of the base of the invention illustrated in FIG. 1.

FIG. 5 is a front perspective view of the base 101 of the invention illustrated in FIG. 1, illustrating the cooled surface 121, which may also be referred to as the surface from which heat is to be transferred or extracted. FIG. 5 shows a groove 120 in the base 101 configured to receive the housing 102 (not shown in FIG. 5), although it will be appreciated by those of ordinary skill in the art that a groove is not required to seat the housing or to practice the invention.

FIG. 6 is a front perspective partial cut-away or partially disassembled view of the embodiment of the invention illustrated in FIG. 1, illustrating spray module or spray cooling system module 100, base 101, housing 102, first housing side 102a, housing first end 102c, cooled surface 121, and coolant inlet coupling 103. The second housing side 102b is removed to show the interior of the spray module 100.

FIG. 6 illustrates an interior cavity the housing 102, baffle 125 with first baffle end 125a at the inlet side to the cooling conduit, second baffle end 125b at the outlet side or downstream side of the cooling conduit. The baffle further has a top surface 125c and a lower surface 125d, with the top surface 125c being the lower surface of the re-circulation conduit in this embodiment of the invention, and the lower surface 125d of the baffle 125 being the top surface of the cooling conduit.

FIG. 6 further illustrates coolant sprays 129 at the inlet side of the coolant conduit, and illustrates a more circular spray pattern than prior narrow gap spray patterns which are more typically a flatter, wider spray pattern more consistent with the shape of the narrow gap. However it will be appreciated by those of ordinary skill in the art that this invention may utilize any one or combination of a number of different known spray patterns, with no one in particular being required to practice this invention.

FIG. 6 also illustrates another aspect or embodiment of this invention wherein the housing is fabricated in one or more pieces, such as a first housing side 102a, a second housing side 102b (not shown in FIG. 6), a first housing end 102c and a second housing end (not shown in FIG. 6). The housing may be molded in one piece in HVM, with the baffle inserted. The inlet component may be a second piece that allows the number of atomizers to be matched to the particular application.

The baffle 125 (also may be referred to as a divider) in its entirety may be integral with the first housing side 102a, the second housing side 102b, and manufactured or molded as such. Alternatively the baffle 125 may be split into two sides like housing sides 102a and 102b which would then abut one another during assembly, as shown in FIG. 6. In FIG. 6 the baffle 125 shown is a first baffle side, with the second baffle side being the same or nearly the same and preferably integral with the second side 102b, and would then be assembled adjacent and abutting the baffle portion in the first housing side 102b. The first housing side 102a and the second housing side 102b may be assembled around first housing end 102c and a second and similar second housing end (which may be integral with the first housing side 102a and/or the second housing side 102b, or a separate piece, for placement on base 101 to house the spray module and to define an interior cavity.

FIG. 6 also illustrates the liquid/vapor separator area 128, with liquid outlet baffle 133 being shown in the separator area 128, as is discussed more fully below in relation to other figures.

FIG. 7 is an elevation cross-section of the embodiment of the invention illustrated in FIG. 1, illustrating spray module or spray cooling system module 100, base 101, housing 102, housing first end 102c, housing second end 102d, cooled surface 121, coolant outlet 105, coolant inlet 104, and coolant inlet coupling 103.

FIG. 7 also illustrates an interior cavity of the housing 102, which includes a cooling conduit 130, a re-circulation conduit 127, a baffle 125 and a separator area 128. The top surface 125c of the baffle is the lower surface of the re-circulation conduit in this embodiment of the invention, and the lower surface 125d of the baffle 125 being the top surface of the cooling conduit.

From a coolant flow and cooling perspective, FIG. 7 illustrates atomized coolant spray 129, the coolant spray 129 being combined with re-circulated coolant vapor 146 at a mixing zone 140 (may also be referred to as a vapor entrainment zone), to provide a combination of liquid and vapor coolant flow to the cooling conduit 130 at an entrance end 130a. The coolant spray 129 is generally comprised of atomized coolant droplets. The combined vapor and liquid coolant then goes through a converging zone 139 where the spray is collected and there is a reduction in the cross-sectional area or volume through which the combination of vapor and liquid spray pass. This converging zone 139 increases the velocity of the coolant flow before it is directed to the entrance side of the cooling conduit 130.

FIG. 7 shows coolant flow 141 through cooling conduit 130, which flows to and through the second end or outlet end 130b of the cooling conduit 130. The coolant flow 141 in the cooling conduit 130 flows over the cooled surface 121, which may also be referred to as the surface from which heat is to be transferred or extracted. The desired flow condition may but need not be the same as or similar to annular flow or dispersed annular flow, for the desired heat transfer characteristics and for improved control over the thin film on the cooled surface 121. The flow through the cooling conduit 130 will generally be two-phase flow meaning both liquid and vapor are flowing, with the liquid preferably being a thin film liquid coolant on the surface from which heat is to be transferred, and also will likely be on the lower side of the baffle. Moving from the cooled surface 121 away toward the center of the cooling conduit 130, the coolant may also be stratified from liquid to vapor in some embodiments. The evaporation or vaporization of the coolant in the cooling conduit is caused by the heat transfer from the cooled surface 121 to the coolant flowing through the cooling cavity 130, and causes expansion of the vapor flowing through the cooling conduit.

The liquid phase and vapor phase coolant flowing through the exit or outlet end 130b of the cooling conduit 130 enters the separator area 128 within the interior cavity of the module housing, where there is a separation of a first vapor portion (represented by arrow 143 in FIG. 7) of the coolant flow from a combination of a liquid portion and a second vapor portion (represented by arrow 142 in FIG. 7). The second vapor portion 142 is routed by liquid outlet baffle 133 and separator 128 through outlet 105 for processing or disposal, as is shown in later figures.

The first vapor portion 143 may include a minimal amount of coolant in the liquid phase even though in embodiments of the invention, it is desirable that the liquid phase be minimized or eliminated through the re-circulation conduit. Embodiments of the cooling system may be configured to transmit heat from the cooling conduit 130 through baffle 125 and to the re-circulation conduit 127 (with the heat represented by arrows 160). The heat 160 may help partially or fully evaporate any liquid phase coolant in the re-circulation conduit 127 or help dry the vapor phase coolant therein, as would be recognized by those of ordinary skill in the art. The flow of coolant through the re-circulation conduit 127 is represented by arrow 144, and arrow 146 depicts the coolant flow 146 being routed to the mixing zone 140 for combining or mixing with the coolant spray 129 and consequently for re-introduction into the cooling conduit.

It is within the contemplation of this invention that the mixing or combining of the re-circulated coolant (which is preferably all in vapor phase) be either partial or complete, although complete may be in theory only.

FIG. 7 also shows the baffle 125 including a first end 125a in the mixing zone, with the first end being angled or sloped at an approximate twenty-two degree angle to reduce the cross-sectional area of the mixture or combination of liquid phase and vapor phase coolant entering the cooling conduit 130. This increases the velocity of the coolant entering the cooling conduit for the reasons set forth above. It will however be appreciated by those of ordinary skill in the art that while the reduction in cross-sectional area may be preferred in some embodiments of this invention, it is not required to practice this invention.

To better facilitate the transfer of heat to the coolant in the re-circulation conduit, fins or other heat transfer enhancements may be added to the baffle in the coolant conduit 130, in the re-circulation conduit 127, or both.

In some prior transverse spray applications in narrow gap evaporative spray cooling the heat flux was in the fifteen to thirty watts per centimeters squared range, whereas it is believed that this invention may be able to achieve heat flux rates in the one hundred to two hundred watts per centimeter squared range.

It will be appreciated by those of ordinary skill in the art that the term narrow gap has a range of meanings and values within the industry and for a given application or embodiment. It is anticipated that for some of the embodiments described herein, the gap will be approximately 0.030 inches.

FIG. 8 is an elevation detail cut-away view of the spray module 100, with the entrance end of the cooling conduit and the spray coolant being sprayed therein, of the embodiment of the invention shown in FIG. 1, illustrating base 101, housing 102 with first housing end 102c, coolant sprays 129, the cooled surface 121, baffle 125 with baffle first end 125a, re-circulation conduit 127, coolant flow 146. FIG. 8 also shows a coolant conduit heat transfer fin 160 in the coolant conduit 130 and a re-circulation conduit heat transfer fin 161 in the re-circulation conduit 127. It will be noted by those of ordinary skill in the art that the fins may be in thermal contact with the cooled surface.

An exemplary embodiment such as FIG. 8 may utilize four atomizers, standard pressed in button type atomizers, with an 0.0083 inch center jet nozzle and 0.0083 inch swirl ports.

FIG. 9 is a side elevation view of an embodiment of the invention which includes an exit zone 175 within the cooling conduit 169 and wherein the baffle is sloped upwardly away from the cooled surface at the exit zone 175 or exit end of the cooling conduit 169. FIG. 9 illustrates one of a number of alternative embodiments or configurations within the scope of this invention, with no one in particular being required to practice this invention.

FIG. 9 shows base 101, housing 102, baffle 170 with a first baffle end 170a and a second baffle end 170b, with both the first baffle end 170a and the second baffle end 170b being sloped upwardly. Sloping the second baffle end 170b upwardly (which is at the exit end of the cooling chamber 169) increases the cross-sectional area of the cooling conduit 169 at and near the exit, which reduces the velocity of the vapor phase coolant and thereby enhances the separation of a desired portion of the vapor phase of the coolant from the liquid phase of the coolant exiting the cooling conduit (with a second portion of vapor phase coolant exiting with it).

FIG. 9 illustrates cooling conduit 169 with distance 172 being in the approximate middle portion of the cooling conduit 169, and distance 171 between the first baffle end 170a and the cooled surface 176, and distance 173 between the second baffle end 170b and the cooled surface 176, and mixing zone converging zone 174.

From a flow perspective, FIG. 9 shows a combination of liquid phase coolant and vapor phase coolant (represented by arrow 180) discharged through outlet 185. Arrow 181 represents the desired portion of vapor phase coolant routed for re-circulation to re-circulation conduit. Arrow 182 represents the flow of vapor phase coolant through re-circulation conduit 186 and arrow 183 represents the vapor phase coolant being provided or introduced near the entrance end of the cooling conduit (in a mixing zone) for combining with atomized liquid coolant (shown in other figures) being sprayed into the entrance end of the cooling conduit 169.

FIG. 10 is a side schematic representation of an embodiment of this invention, showing an alternative configuration relative to the surface from which heat is to be transferred, showing spray module 200, housing 201, spray module discharge or outlet 202, interior cavity 212, baffle 210, coolant spray 214, mixing zone 213 and cooling conduit 211. FIG. 10 also illustrates other components of a spray cooling system which may be outside of the spray module or housing, namely discharge conduit 203 to condenser 204, and conduit 205 from condenser 204 to pump 206. Also shown in this figure is an optional coolant heater or pre-heater 215, which is discussed more fully above, which may be utilized in some embodiments of this invention, but with no particular type being required to practice this invention.

Those of ordinary skill in the art will recognize and understand the other components schematically depicted in this figure and they will not therefore be described in any further detail.

FIG. 10 schematically illustrates a configuration in which bare die is cooled, also referred to as a direct contact cooling embodiment.

Figure 11:
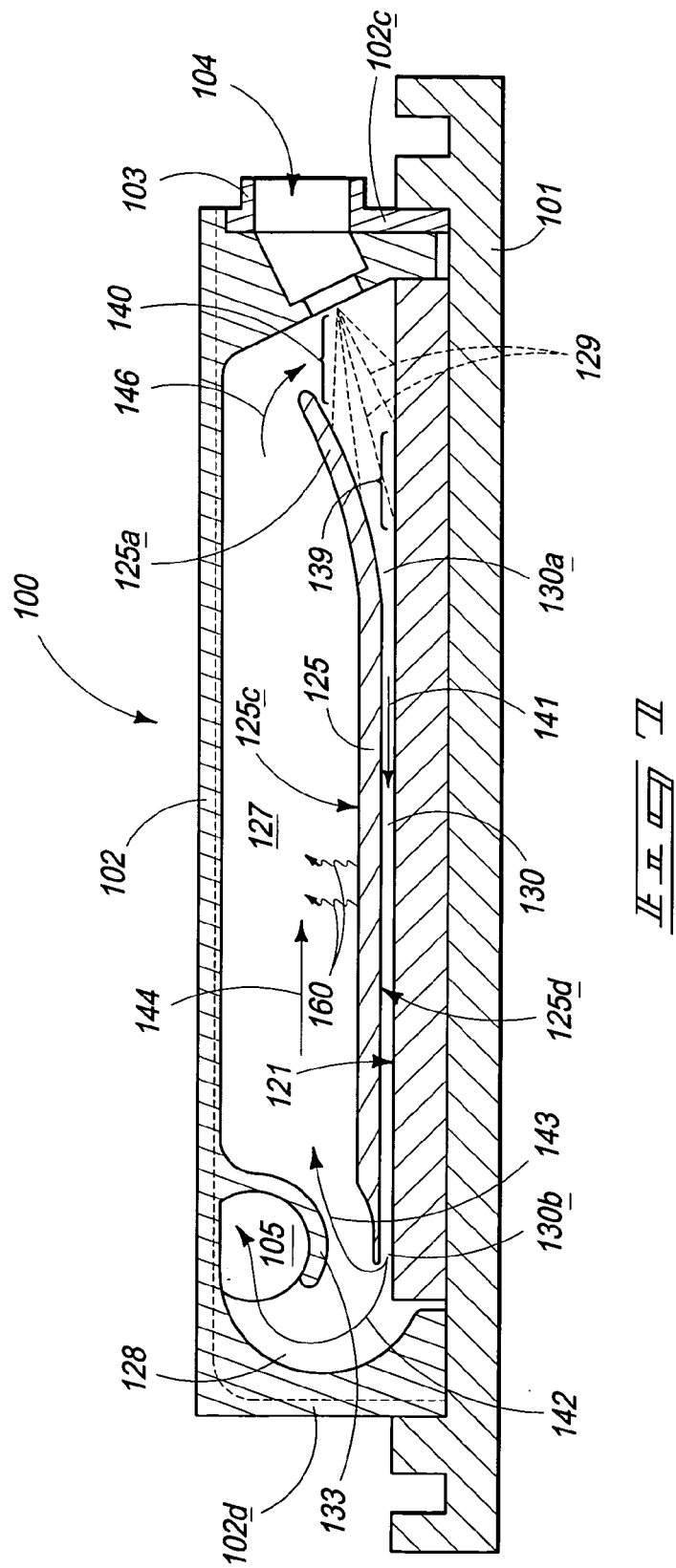
FIG. 11 is a side schematic representation of an embodiment of this invention, showing an alternative configuration relative to the surface from which heat is to be transferred, schematically illustrating a bare die or direct contact embodiment as shown in FIG. 10, only with a different surface roughness or configuration.
Figure 11:
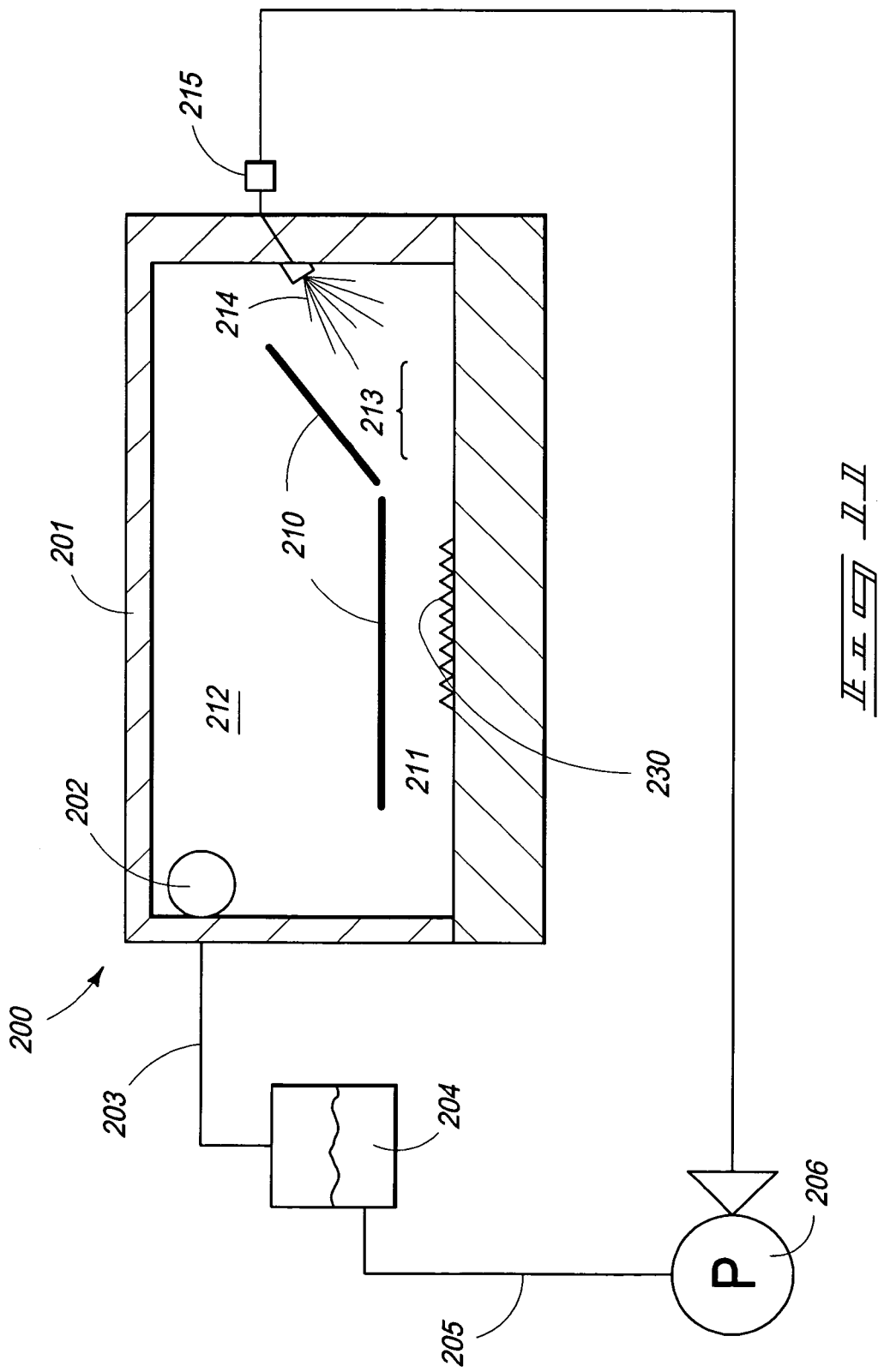
Figure 11:
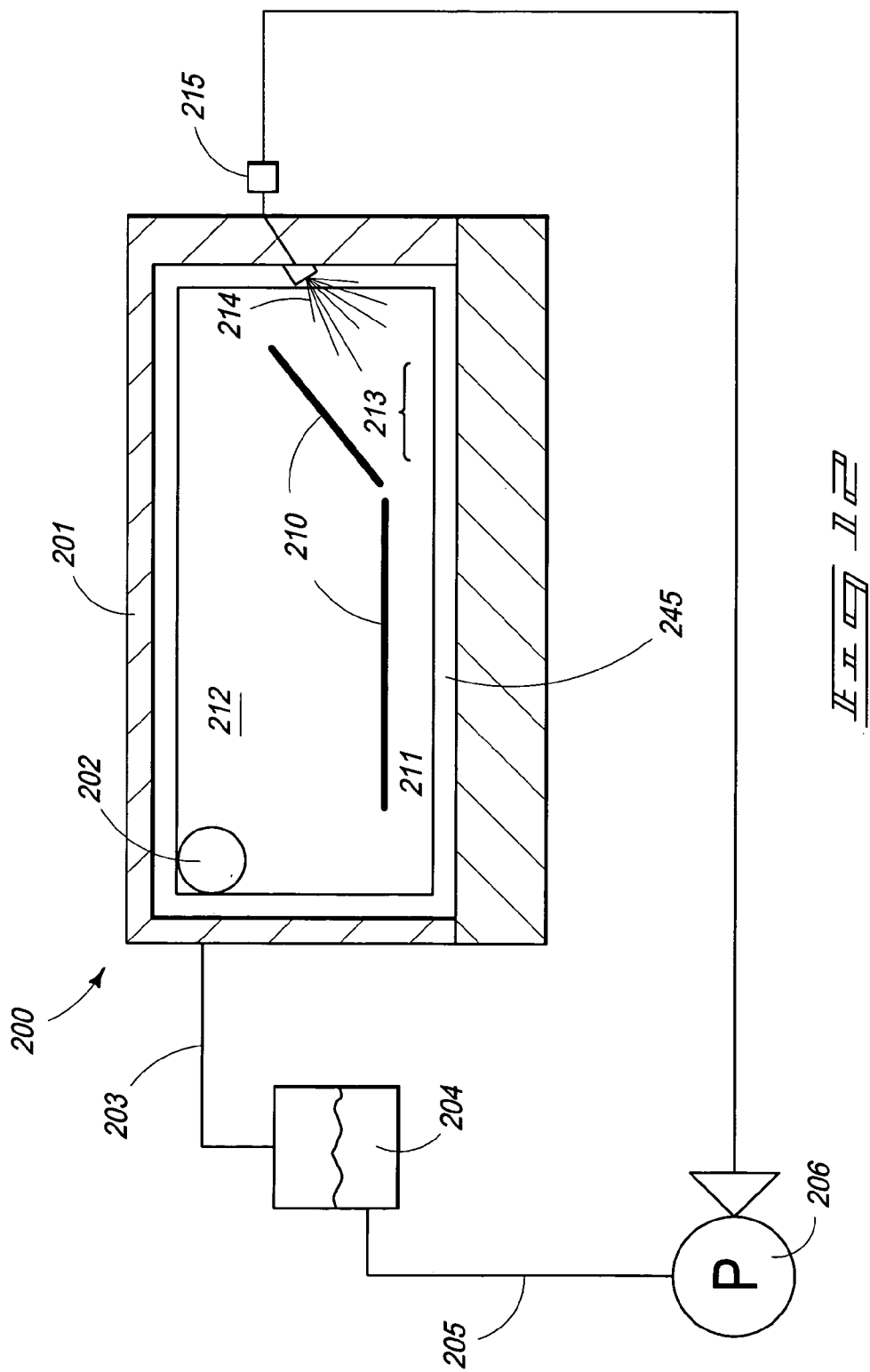
Figure 11:
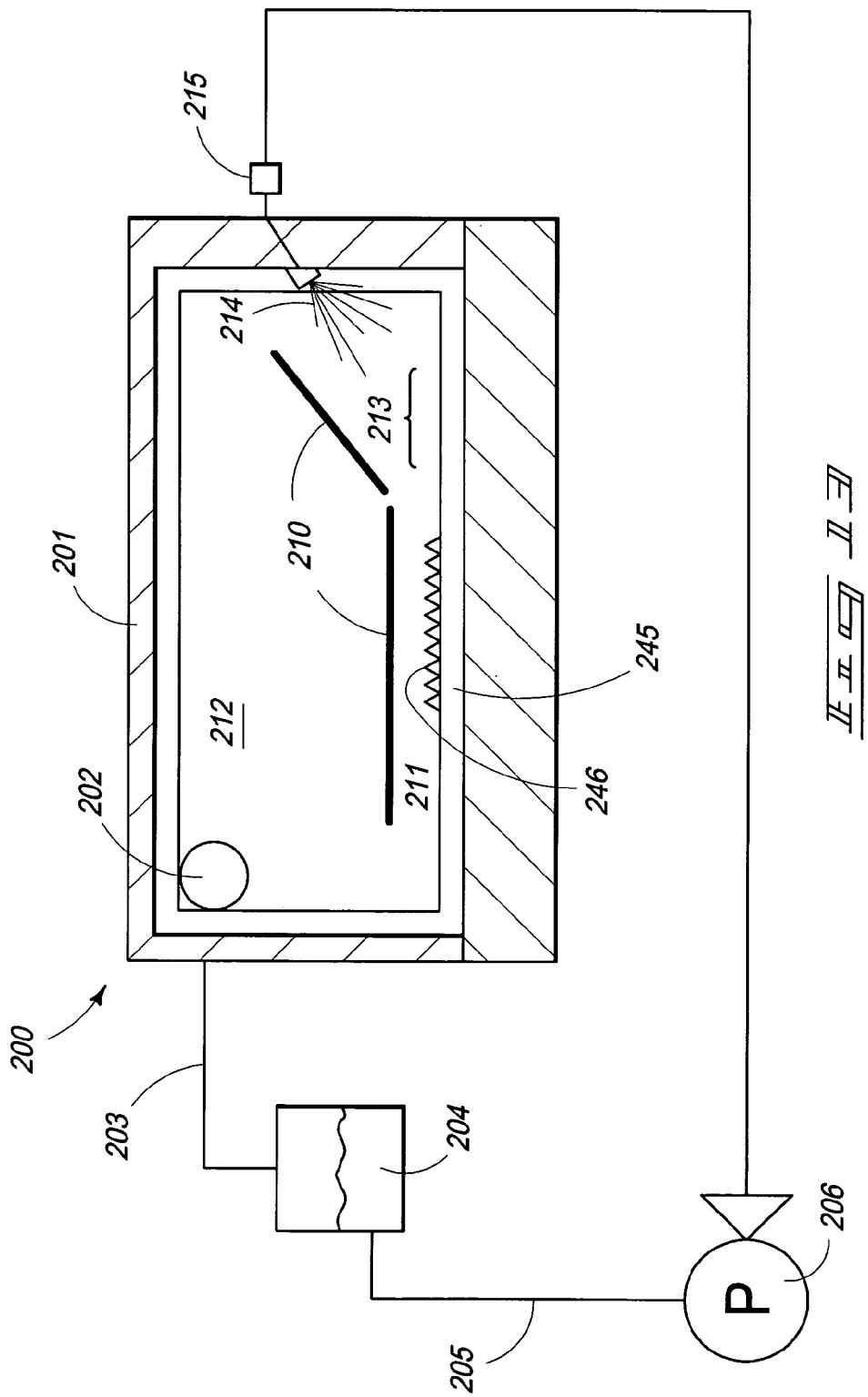

FIG. 11 is a side schematic representation of an embodiment of this invention, showing an alternative configuration relative to the surface from which heat is to be transferred, showing spray module 200, housing 201, spray module discharge or outlet 202, interior cavity 212, baffle 210, coolant spray 214, mixing zone 213 and cooling conduit 211. FIG. 11 also illustrates other components of a spray cooling system which may be outside of the spray module or housing, namely discharge conduit 203 to condenser 204, and conduit 205 from condenser 204 to pump 206.

Also shown in FIG. 11 is an optional coolant heater or pre-heater 215, which is discussed more fully above, which may be utilized in some embodiments of this invention, but with no particular type being required to practice this invention. FIG. 11 illustrates a system similar to that shown in FIG. 10, only it further includes a surface roughness 230 or configuration on the cooled surface, for enhanced or altered heat transfer characteristics to the surface from which heat is to be transferred.

FIG. 12 is a side schematic representation of an embodiment of this invention, showing an alternative configuration relative to the surface from which heat is to be transferred, showing spray module 200, housing 201, spray module discharge or outlet 202, interior cavity 212, baffle 210, coolant spray 214, mixing zone 213 and cooling conduit 211. FIG. 12 also illustrates other components of a spray cooling system which may be outside of the spray module or housing, namely discharge conduit 203 to condenser 204, and conduit 205 from condenser 204 to pump 206.

Also shown in this figure is an optional coolant heater or pre-heater 215, which is discussed more fully above, which may be utilized in some embodiments of this invention, but with no particular type being required to practice this invention. FIG. 12 illustrates a system similar to that shown in FIG. 10, only it schematically illustrating a cold plate embodiment, showing cold plate 245 which interfaces with and transfers heat from the source of heat such as an integrated circuit chip. In this embodiment, the surface of the cold plate would be the cooled surface or the surface from which heat is to be transferred or removed.

FIG. 13 is a side schematic representation of an embodiment of this invention, showing an alternative configuration relative to the surface from which heat is to be transferred, showing spray module 200, housing 201, spray module discharge or outlet 202, interior cavity 212, baffle 210, coolant spray 214, mixing zone 213 and cooling conduit 211. FIG. 13 also illustrates other components of a spray cooling system which may be outside of the spray module or housing, namely discharge conduit 203 to condenser 204, and conduit 205 from condenser 204 to pump 206.

Also shown in this figure is an optional coolant heater or pre-heater 215, which is discussed more fully above, which may be utilized in some embodiments of this invention, but with no particular type being required to practice this invention. FIG. 13 illustrates a cold plate 245 system similar to that shown in FIG. 12, only it further includes a surface roughness 246 or configuration on the cooled surface, for enhanced or altered heat transfer characteristics to the surface from which heat is to be transferred.

FIG. 14 is a side schematic representation of an embodiment of this invention, showing an alternative configuration relative to the surface from which heat is to be transferred, showing spray module 200, housing 201, spray module discharge or outlet 202, interior cavity 212, baffle 210, coolant spray 214, mixing zone 213 and cooling conduit 211. FIG. 14 also illustrates other components of a spray cooling system which may be outside of the spray module or housing, namely discharge conduit 203 to condenser 204, and conduit 205 from condenser 204 to pump 206.

Also shown in this figure is an optional coolant heater or pre-heater 215, which is discussed more fully above, which may be utilized in some embodiments of this invention, but with no particular type being required to practice this invention. FIG. 14 illustrates a system similar to that shown in FIG. 10, only it schematically illustrating a direct contact embodiment, showing direct cooling on a chip 250, which may be any one of a number of different types of devices from which heat is to be transferred.

Figure 15:
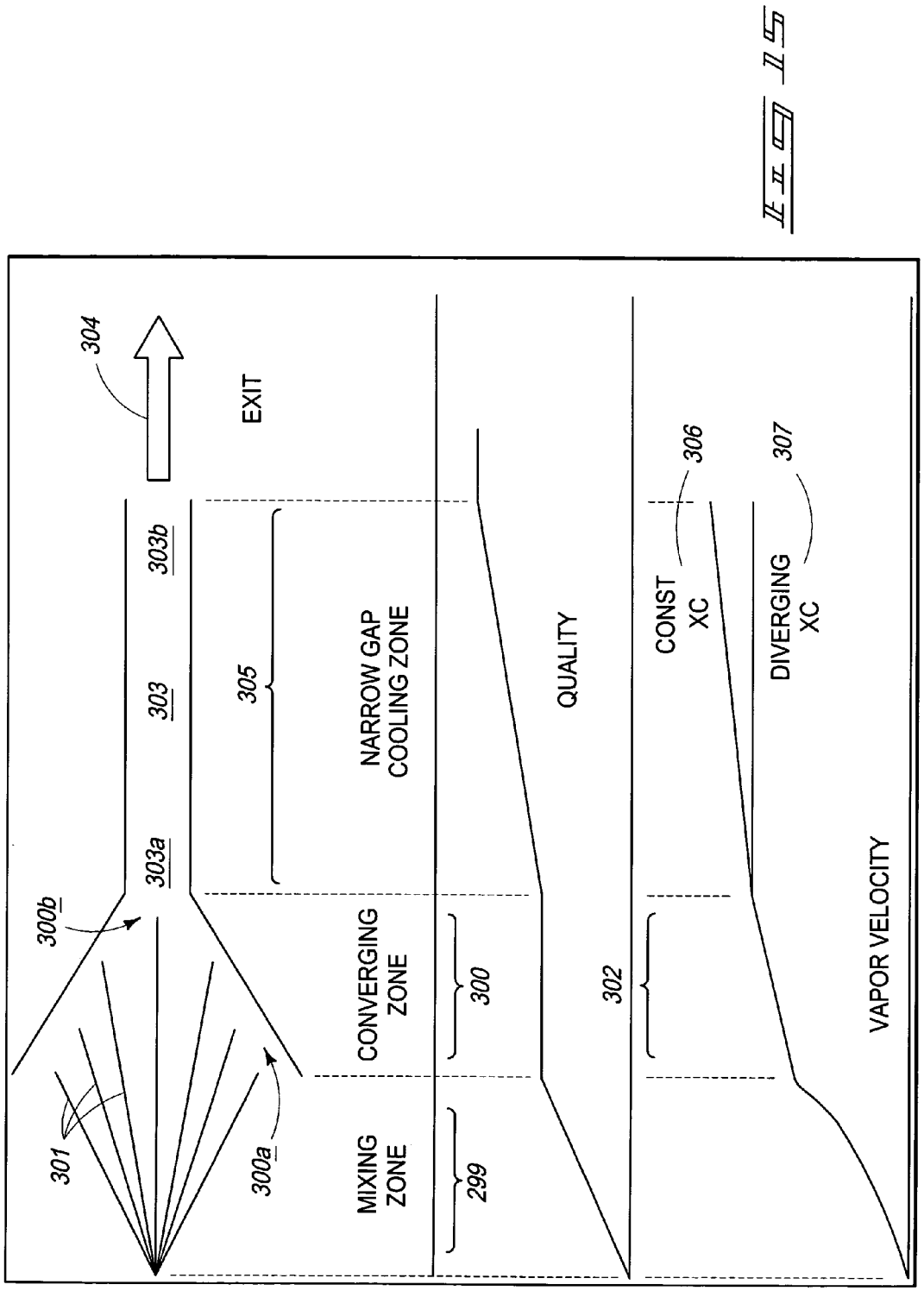
FIG. 15 is a schematic table or graph of quality and vapor velocity in some of the different possible zones, portions or phases of one embodiment of the invention.

FIG. 15 is a schematic table or graph of quality and vapor velocity in some of the different possible zones, portions or phases of one embodiment of the invention. FIG. 15 shows a schematic of the mixing zone 299, which may also be referred to as the vapor entrainment zone. In this zone, phase or area, the re-circulated vapor phase coolant is mixed with or entrained in the liquid coolant 301 atomized or sprayed toward the cooling conduit 303. The cooling conduit 303 may also be referred to as the narrow gap cooling zone 305.

The combination of the re-circulated vapor and the atomized liquid coolant then pass through a spray collection and vapor acceleration zone or section, in which there is a reduction in the cross-sectional area which the combination passes through. For reference, this will be referred to as the converging zone 300. Converging zone 300 includes converging zone entry 300a and converging zone exit 300b, each with a cross-sectional area, and wherein the cross-sectional area of the converging zone entry 300a is greater than the cross-sectional area of the converging zone exit 300*b*. This results in an increase in the velocity and changes the nature of the flow of the combination of vapor and liquid before it enters the cooling conduit 303 portion or zone. There is an entrance side 303*a* and an exit side 303*b* to the cooling conduit 303.

The quality of the flow referenced in the middle portion of FIG. 15 is measured as a percent of mass to the sum of vapor and liquid mass.

The vapor velocity shown in the lower portion of FIG. 15 at the various zones or locations is believed to reflect a general graph and not be specific to any given embodiment of this invention, but show The calculated vapor velocity at 300*a* is approximately seven (7) m/s; 300*b* is twelve m/s or higher; and 303*b* is about fifteen (15) m/s. for a constant cross section version. The invention however is not limited to these calculated values, but instead they are given as exemplary calculations.

Figure 16:
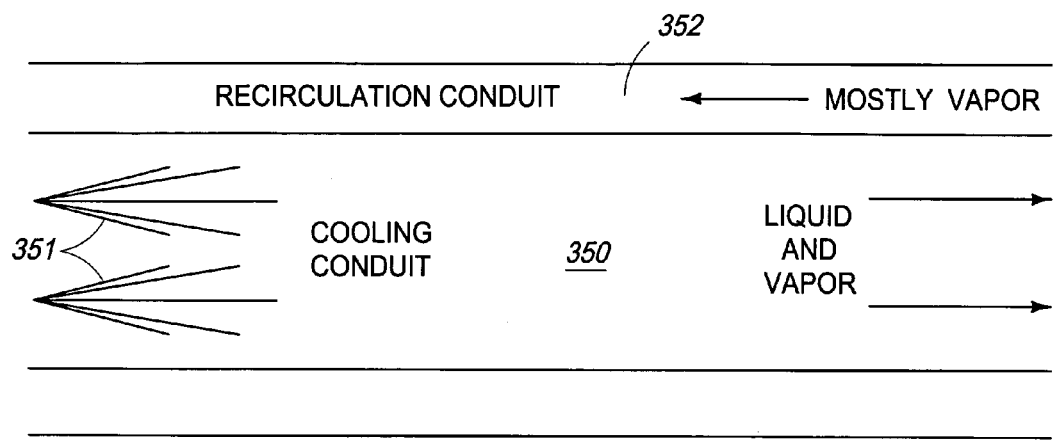
FIG. 16 is a schematic representation or example of the flow through a cooling conduit and one or more re-circulation conduits.

FIG. 16 is a schematic representation or example of the flow through a cooling conduit and one or more re-circulation conduits, showing cooling conduit 350 with two atomized spray cones 351, and the resultant liquid and vapor flowing through the cooling conduit 350. The channel or conduit vertically above the cooling conduit is a re-circulation conduit 352 which is intended to preferably channel or route vapor only back to the entrance side of the cooling conduit 350 as shown. However as explained more fully herein, some liquid may find its way into the re-circulation channel.

Figure 17:
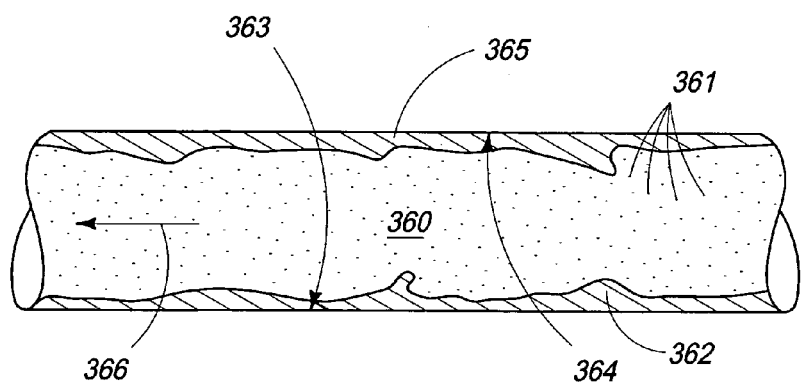
FIG. 17 is a schematic depiction of a form of annular flow in a conduit, showing the liquid phase and the vapor phase in the center or away from the surface to be cooled.
Figure 11B:
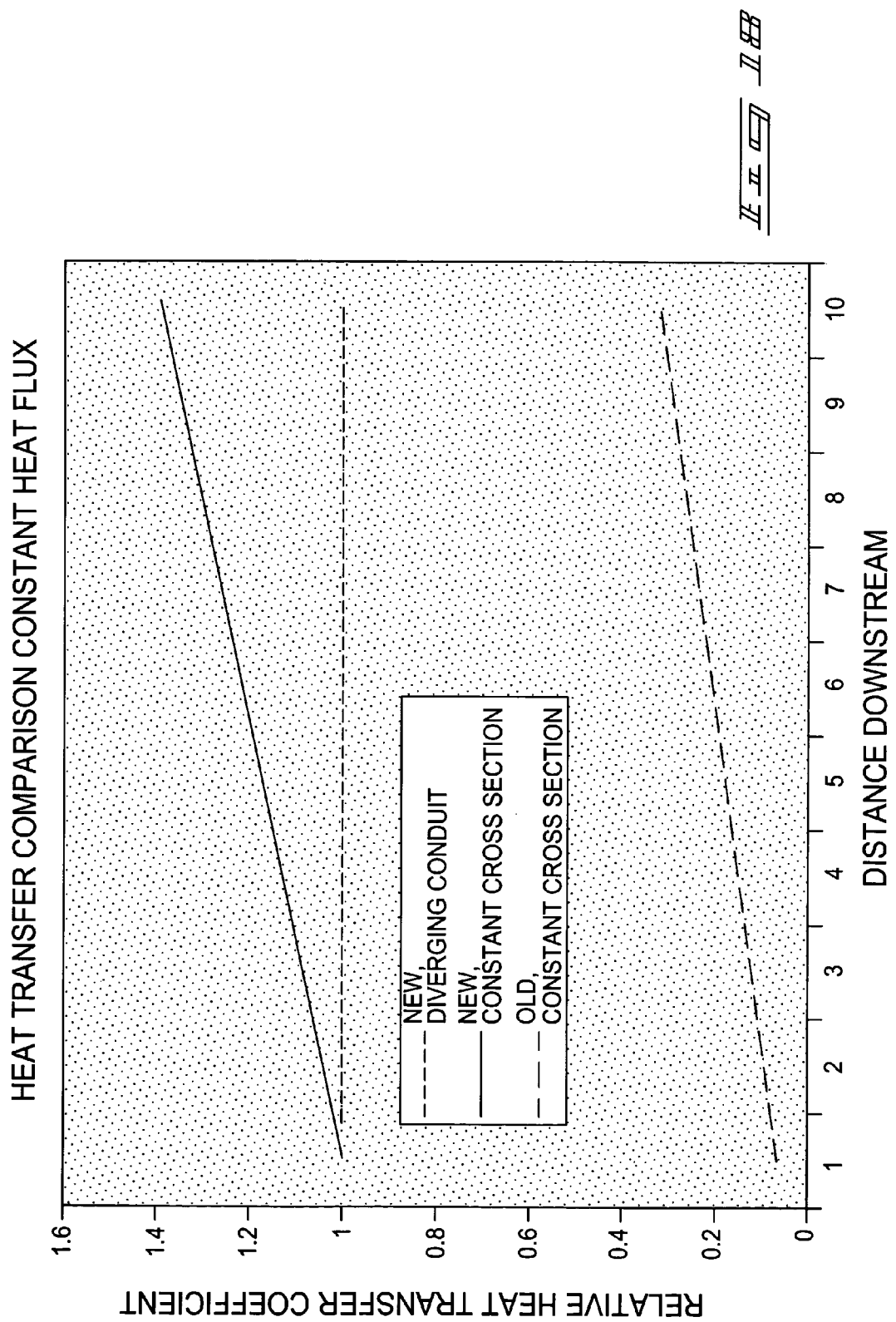

FIG. 17 is a schematic depiction of a form of annular flow in a conduit, showing the liquid phase and the vapor phase in the center or away from the surface to be cooled. FIG. 17 shows coolant conduit 360 with the cooling surface 363 or the surface from which heat is to be transferred, a thin film 362 of coolant on the cooling surface 363 and flow in the direction of arrow 366. The lower surface 365 of the baffle is also shown with a thin film 365 of liquid coolant on it, with the vapor 361 in the center assisting in the maintenance of the thin film on both the top and the bottom.

While the flow shown in FIG. 17 appears close to or is what is generally referred to as "annular flow", there is no particular type of flow required to practice this invention.

FIG. 18 is a chart or table showing a transfer comparison between a relative heat transfer coefficient at various distances downstream from the entrance of the cooling conduit, in one embodiment of the invention tested. A comparison was made between the prior constant cross section with no improved separator, re-circulation conduit, no mixing zone and no converging zone (this is represented by the hidden lines as shown).

The values shown in FIG. 18 are calculated values based on the flow rate, fluid properties, geometry and inlet quality at 300*b*. The "old" line is from a prior transverse spray cooling application and tends to match the calculated values. The "new" line or graph illustrates an improvement by the present invention.

A second scenario was tested, using the new separator (as disclosed herein), the mixing or vapor entrainment zone, but no converging zone (no reduction on the cross-sectional area).

A third scenario has been calculated in which the convergent zone or area where the cross-sectional area is reduced was added to the configuration in the second scenario, and the results are shown in FIG. 18. In these measurements for these various embodiments, the new converging conduit with the re-circulation conduit, showed the most desirable results. The reduction in the convergent zone shown may be any one of a number of different ratios within the contemplation of this invention, with no one in particular being required to practice this invention, such as a seven-to-one (7:1) reduction ratio.

The relative heat transfer coefficient when the diverging zone is used upstream from the entrance to the cooling conduit shows a relatively constant heat transfer coefficient throughout the length of the cooling conduit measured. As will be appreciated by those of ordinary skill in the art, this results in a greatly reduced or eliminated temperature gradients along the surface from which heat is to be transferred, which is desired in the cooling of electronic components in particular.

FIG. 19 is a schematic illustration of an embodiment of a re-circulation separator which may be utilized by this invention. FIG. 19 shows a spray module 430, housing 431, with a cooling conduit 434, and coolant outlet or exit port 428, a re-circulation conduit 436 and a separator area 429. Arrow 439 shows the flow of coolant through the cooling conduit 434, with thin film 433 on the cooled surface 428, and vapor coolant 435 in the center portion of the cooling conduit 434. In the separator area 429, a portion of the vapor is directed to the re-circulation conduit 436 for routing to the entrance side of the cooling conduit 434 for mixing with newly atomized spray coolant. The re-circulation conduit 436 contains mostly vapor 437, but may also contain some liquid film 438.

To the extent there is sufficient heat transfer through the baffle 427, the heat transferred through the baffle 427 to the re-circulation conduit 436 may cause the thin liquid film 438 (if any) to evaporate, and may also result in a drying of the vapor 437 within the re-circulation chamber.

As will be appreciated by those of reasonable skill in the art, there are numerous embodiments to this invention, and variations of elements and components which may be used, all within the scope of this invention.

One embodiment of this invention, for example, is a narrow gap evaporative spray cooling system comprised of: a mixing zone in which a flow of atomized liquid coolant and a flow of vaporized coolant are combined; a cooling conduit comprised of: a converging zone disposed to receive a combined flow of the atomized liquid coolant and of the vaporized coolant from the mixing zone, the converging zone of the cooling conduit having a converging zone entry cross-sectional area and a converging zone exit cross-sectional area, wherein the converging zone entry cross-sectional area is greater than the converging zone exit cross-sectional area; and a narrow gap cooling zone disposed to receive the combined flow of the atomized liquid coolant and of the vaporized coolant from the converging zone exit; and further wherein the narrow gap cooling zone includes a surface from which heat is to be transferred.

The embodiment of the invention discussed in the preceding paragraph may further comprise: wherein the vapor is entrained with the atomized liquid coolant in the mixing zone; further wherein the converging zone is configured to provide an annular flow for re-introduction into the narrow gap cooling zone, thereby facilitating a more consistent transfer of heat along the entire length of the surface from which heat is to be transferred; further wherein the converging zone is configured to provide an annular flow for re-introduction into the narrow gap cooling zone, thereby facilitating a more consistent flow pressure along the entire length of the surface from which heat is to be transferred; and/or further comprising a separation zone, the separation zone being configured to receive the combined flow of atomized liquid coolant and vaporized coolant, and a newly vaporized coolant flow from the narrow gap cooling zone, and to direct at least a portion of the vaporized coolant to a re-circulation conduit.

In another embodiment of the invention, a feed system for a narrow gap evaporative spray cooling system is provided which is comprised of: a feed system framework with an internal cavity; a mixing zone in the internal cavity, the mixing zone configured to receive and combine a flow of atomized liquid coolant and a flow of vaporized coolant; a converging zone within the framework and disposed to receive a combined flow of the atomized liquid coolant and of the vaporized coolant from the mixing zone, the converging zone of the cooling conduit having a converging zone entry cross-sectional area and a converging zone exit cross-sectional area, wherein the converging zone entry cross-sectional area is greater than the converging zone exit cross-sectional area; and the converging zone being further configured to provide the combined flow of the atomized liquid coolant and of the vaporized coolant to a narrow gap evaporative spray cooling conduit. This embodiment may further be: further wherein the vapor is entrained with the atomized liquid coolant in the mixing zone; and/or further wherein the converging zone is configured to provide the combined flow of the atomized liquid coolant and of the vaporized coolant to the narrow gap evaporative spray cooling conduit in an annular flow.

In another embodiment of the invention, a narrow gap evaporative spray cooling housing system is provided which is comprised of: a housing comprised of: a top surface; a lower surface from which heat is to be transferred; a first end wall and a second end wall; a first side wall and a second side wall; wherein the top surface, lower surface, first end wall, second end wall, first side wall and second side wall generally define the housing; a baffle with a top surface and a lower surface, the baffle being attached to at least one of the first side wall or the second side wall and positioned horizontally between the top surface and the lower surface of the housing; the lower baffle surface combining with the lower surface of the housing to define a narrow gap cooling conduit; and the upper baffle surface combining with the top surface of the housing to define a re-circulation conduit; and at least one atomizer at a first end of the housing and configured to spray a coolant toward the narrow gap cooling conduit.

The embodiment of the invention described in the preceding paragraph may further: be configured wherein the baffle thermally conducts heat received from the cooling conduit to the re-circulation conduit; wherein the baffle further comprises a first baffle end and a second baffle end, the first baffle end being an entrance distance from the lower surface of the housing; and further wherein the entrance distance is greater than an intermediate distance between the lower surface of the baffle and the lower surface of the housing; and/or further wherein the baffle further comprises a first baffle end and a second baffle end: the first baffle end combined with the first side wall, the second side wall and the lower surface of the housing to define an entrance cross-sectional area; the second baffle end combined with the first side wall, the second side wall and the lower surface of the housing, defines an exit cross-sectional area; and wherein the entrance cross-sectional area is greater than the exit cross-sectional area. A still further embodiment of the one described in the preceding paragraph may be wherein the baffle comprises a first baffle end and a second baffle end: the first baffle end combined with the first side wall, the second side wall and the lower surface of the housing to define an entrance cross-sectional area; an intermediate location on the lower surface of the baffle end combined with the first side wall, the second side wall and the lower surface of the housing, defines an intermediate cross-sectional area; and wherein the entrance cross-sectional area is greater than the intermediate cross-sectional area.

In yet another embodiment of the invention, a housing system for narrow gap evaporative spray cooling is provided which is comprised of the following: a housing with an interior cavity; a baffle attached to the housing such that it is intermediately positioned within the interior cavity of the housing; an upper surface of the baffle combined with the interior cavity of the housing generally defining a vapor re-circulation conduit; a lower surface of the baffle and combined with the interior cavity of the housing generally defining a narrow gap cooling conduit; and wherein the baffle is thermally conductive and disposed to provide heat to the vapor re-circulation conduit.

In addition to the embodiment described in the preceding paragraph, the housing system may be further: wherein the baffle is disposed to receive heat from the narrow gap cooling conduit and to provide said heat to the vapor re-circulation conduit; wherein the baffle is disposed to conductively receive heat from the housing and to provide said heat to the vapor re-circulation conduit; wherein the baffle is disposed to conductively receive heat from the housing and to provide said heat to the vapor re-circulation conduit; and/or further wherein the baffle is disposed to receive heat from the narrow gap cooling conduit and to conductively receive heat from the housing, and to provide said heat to the vapor re-circulation conduit.

In another embodiment of the invention, a housing system for narrow gap evaporative spray cooling is provided, which is comprised of the following: a housing with an interior cavity; a baffle attached to the housing such that it is intermediately positioned within the interior cavity of the housing; a lower surface of the baffle combined with the interior cavity of the housing to generally define a narrow gap cooling conduit; an upper surface of the baffle combined with the interior cavity of the housing to generally define a vapor re-circulation conduit; a vapor separator cavity between the narrow gap cooling conduit and the vapor re-circulation conduit, the vapor separator cavity configured to receive liquid and vapor from the narrow gap cooling conduit, and to provide at least a portion of the vapor to the vapor re-circulation conduit; wherein the vapor re-circulation conduit is further configured to provide vapor for re-introduction into the narrow gap cooling conduit; and further wherein the vapor re-circulation conduit is substantially located vertically above the narrow gap cooling conduit.

In yet another embodiment of the invention, a housing system for narrow gap evaporative spray cooling is provided which is comprised of the following: a housing with an interior cavity; a baffle attached to the housing such that it is intermediately positioned within the interior cavity of the housing; a lower surface of the baffle combined with the interior cavity of the housing to generally define a narrow gap cooling conduit; an upper surface of the baffle combined with the interior cavity of the housing to generally define a vapor re-circulation conduit; a vapor separator cavity between the narrow gap cooling conduit and the vapor re-circulation conduit, the vapor separator cavity configured to receive liquid and vapor from the narrow gap cooling conduit, and to provide at least a portion of the vapor to the vapor re-circulation conduit; and wherein the vapor re-circulation conduit is further configured to provide vapor for re-introduction into the narrow gap cooling conduit.

In yet another embodiment of the invention, a method of reducing a temperature gradient across a surface to be evaporative spray cooled in a narrow gap enclosure is provided which comprises: providing a housing with an interior cavity, the housing including: a baffle attached to the housing such that it is intermediately positioned within the interior cavity of the housing; an upper surface of the baffle combined with the interior cavity of the housing generally defining a vapor re-circulation conduit; and a lower surface of the baffle and combined with the interior cavity of the housing generally defining a narrow gap cooling conduit; spraying coolant into an entrance of the cooling conduit; and recirculating at least part of vaporized coolant exiting the cooling conduit through the vapor re-circulation conduit and back into the entrance of the cooling conduit to increase heat transfer on the surface to be spray cooled toward the entrance side of the cooling conduit.

In yet another method embodiment of the invention, a method of reducing a pressure gradient across a surface to be evaporative spray cooled in a narrow gap enclosure is provided which is comprised of: providing a housing with an interior cavity, the housing including: a baffle attached to the housing such that it is intermediately positioned within the interior cavity of the housing; an upper surface of the baffle combined with the interior cavity of the housing generally defining a vapor re-circulation conduit; and a lower surface of the baffle and combined with the interior cavity of the housing generally defining a narrow gap cooling conduit; spraying coolant into an entrance of the cooling conduit; recirculating at least part of vaporized coolant exiting the cooling conduit through the vapor re-circulation conduit and back into the entrance of the cooling conduit to increase pressure at the entrance of the cooling, and thereby reduce a pressure gradient through the coolant conduit.

In still another embodiment of the invention, a housing system for narrow gap evaporative spray cooling is provided, which is comprised of the following: a housing means with an interior cavity; a baffle means attached to the housing means such that it is intermediately positioned within the interior cavity of the housing means, an upper surface of the baffle means combined with the interior cavity of the housing generally defining a vapor re-circulation conduit; and a lower surface of the baffle means combined with the interior cavity of the housing means generally defining a narrow gap cooling conduit; wherein the baffle means is thermally conductive and disposed to provide heat to the vapor re-circulation conduit.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A narrow gap evaporative spray cooling system comprised of:
   a mixing zone in which a flow of atomized liquid coolant and a flow of vaporized coolant are combined;
   a cooling conduit comprised of:
      a converging zone disposed to receive a combined flow of the atomized liquid coolant and of the vaporized coolant from the mixing zone, the converging zone of the cooling conduit having a converging zone entry cross-sectional area and a converging zone exit cross-sectional area, wherein the converging zone entry cross-sectional area is greater than the converging zone exit cross-sectional area; and
      a narrow gap cooling zone disposed to receive the combined flow of the atomized liquid coolant and of the vaporized coolant from the converging zone exit; and further wherein the narrow gap cooling zone includes a surface from which heat is to be transferred.

2. A narrow gap evaporative spray cooling system as recited in claim 1, and further wherein the vapor is entrained with the atomized liquid coolant in the mixing zone.

3. A narrow gap evaporative spray cooling system as recited in claim 1, and further wherein the converging zone is configured to provide an annular flow to an entrance of the narrow gap cooling zone, thereby facilitating a more consistent transfer of heat along the entire length of the surface from which heat is to be transferred.

4. A narrow gap evaporative spray cooling system as recited in claim 1, and further wherein the converging zone is configured to provide an annular flow to an entrance of the narrow gap cooling zone, thereby facilitating a more consistent flow pressure along the entire length of the surface from which heat is to be transferred.

5. A narrow gap evaporative spray cooling system as recited in claim 1, and further comprising a separation zone, the separation zone being configured to receive the combined flow of atomized liquid coolant and vaporized coolant, and a newly vaporized coolant flow from the narrow gap cooling zone, and to direct at least a portion of the vaporized coolant to a re-circulation conduit.

6. A narrow gap evaporative spray cooling system as recited in claim 5, and further wherein the re-circulation conduit is configured to provide vaporized coolant to the mixing zone.

7. A feed system for a narrow gap evaporative spray cooling system comprised of:
   a feed system framework with an internal cavity;
   a mixing zone in the internal cavity, the mixing zone configured to receive and combine a flow of atomized liquid coolant and a flow of vaporized coolant;
   a converging zone within the framework and disposed to receive a combined flow of the atomized liquid coolant and of the vaporized coolant from the mixing zone, the converging zone of the cooling conduit having a converging zone entry cross-sectional area and a converging zone exit cross-sectional area, wherein the converging zone entry cross-sectional area is greater than the converging zone exit cross-sectional area; and
   the converging zone being further configured to provide the combined flow of the atomized liquid coolant and of the vaporized coolant to a narrow gap evaporative spray cooling conduit.

8. A feed system for a narrow gap evaporative spray cooling system as recited in claim 7, and further wherein a vapor is entrained with the atomized liquid coolant in the mixing zone.

9. A feed system for a narrow gap evaporative spray cooling system as recited in claim 7, and further wherein the converging zone is configured to provide the combined flow of the atomized liquid coolant and of the vaporized coolant to the narrow gap evaporative spray cooling conduit in an annular flow.

10. A narrow gap evaporative spray cooling housing system, comprised of:
   a housing comprised of:

a top surface;

a lower surface from which heat is to be transferred;

a first end wall and a second end wall;

a first side wall and a second side wall;

wherein the top surface, lower surface, first end wall, second end wall, first side wall and second side wall generally define the housing;

a baffle with a upper surface and a lower surface, the baffle being attached to at least one of the first side wall or the second side wall and positioned horizontally between the top surface and the lower surface of the housing;

the lower baffle surface combining with the lower surface of the housing to define a narrow gap cooling conduit; and the upper baffle surface combining with the top surface of the housing to define a re-circulation conduit; and at least one atomizer at a first end of the housing and configured to spray a coolant toward the narrow gap cooling conduit.

11. A narrow gap evaporative spray cooling housing system as recited in claim 10, and further wherein the baffle thermally conducts heat received from the cooling conduit to the re-circulation conduit.

12. A narrow gap evaporative spray cooling housing system as recited in claim 10, and wherein the baffle further comprises a first baffle end and a second baffle end, the first baffle end being an entrance distance from the lower surface of the housing; and further wherein the entrance distance is greater than an intermediate distance between the lower surface of the baffle and the lower surface of the housing.

13. A narrow gap evaporative spray cooling housing system as recited in claim 10, and wherein the baffle further comprises a first baffle end and a second baffle end:

the first baffle end combined with the first side wall, the second side wall and the lower surface of the housing to define an entrance cross-sectional area;

the second baffle end combined with the first side wall, the second side wall and the lower surface of the housing, defines an exit cross-sectional area; and wherein the entrance cross-sectional area is greater than the exit cross-sectional area.

14. A narrow gap evaporative spray cooling housing system as recited in claim 10, and wherein the baffle further comprises a first baffle end and a second baffle end:

the first baffle end combined with the first side wall, the second side wall and the lower surface of the housing to define an entrance cross-sectional area;

an intermediate location on the lower surface of the baffle end combined with the first side wall, the second side wall and the lower surface of the housing, defines an intermediate cross-sectional area; and wherein the entrance cross-sectional area is greater than the intermediate cross-sectional area.

15. A housing system for narrow gap evaporative spray cooling, comprised of the following:

a housing with an interior cavity;

a baffle attached to the housing such that it is intermediately positioned within the interior cavity of the housing;

an upper surface of the baffle combined with the interior cavity of the housing generally defining a vapor re-circulation conduit;

a lower surface of the baffle and combined with the interior cavity of the housing generally defining a narrow gap cooling conduit; and wherein the baffle is thermally conductive and disposed to provide heat to the vapor re-circulation conduit.

16. A housing system for narrow gap evaporative spray cooling as recited in claim 15, and further wherein the baffle is disposed to receive heat from the narrow gap cooling conduit and to provide said heat to the vapor re-circulation conduit.

17. A housing system for narrow gap evaporative spray cooling as recited in claim 15, and further wherein the baffle is disposed to conductively receive heat from the housing and to provide said heat to the vapor re-circulation conduit.

18. A housing system for narrow gap evaporative spray cooling as recited in claim 17, and further wherein the baffle is disposed to conductively receive heat from the housing and to provide said heat to the vapor re-circulation conduit.

19. A housing system for narrow gap evaporative spray cooling as recited in claim 15, and further wherein the baffle is disposed to receive heat from the narrow gap cooling conduit and to conductively receive heat from the housing, and to provide said heat to the vapor re-circulation conduit.

20. A housing system for narrow gap evaporative spray cooling, comprised of the following:

a housing with an interior cavity;

a baffle attached to the housing such that it is intermediately positioned within the interior cavity of the housing;

a lower surface of the baffle combined with the interior cavity of the housing to generally define a narrow gap cooling conduit;

an upper surface of the baffle combined with the interior cavity of the housing to generally define a vapor re-circulation conduit;

a vapor separator cavity between the narrow gap cooling conduit and the vapor re-circulation conduit, the vapor separator cavity configured to receive liquid and vapor from the narrow gap cooling conduit, and to provide at least a portion of the vapor to the vapor re-circulation conduit;

wherein the vapor re-circulation conduit is further configured to provide vapor for re-introduction into the narrow gap cooling conduit; and further wherein the vapor re-circulation conduit is substantially located vertically above the narrow gap cooling conduit.

21. A housing system for narrow gap evaporative spray cooling, comprised of the following:

a housing with an interior cavity;

a baffle attached to the housing such that it is intermediately positioned within the interior cavity of the housing;

a lower surface of the baffle combined with the interior cavity of the housing to generally define a narrow gap cooling conduit;

an upper surface of the baffle combined with the interior cavity of the housing to generally define a vapor re-circulation conduit;

a vapor separator cavity between the narrow gap cooling conduit and the vapor re-circulation conduit, the vapor separator cavity configured to receive liquid and vapor from the narrow gap cooling conduit, and to provide at least a portion of the vapor to the vapor re-circulation conduit; and wherein the vapor re-circulation conduit is further configured to provide vapor for re-introduction into the narrow gap cooling conduit.

22. A method of reducing a temperature gradient across a surface to be evaporative spray cooled in a narrow gap enclosure, comprising:
  providing a housing with an interior cavity, the housing including:
    a baffle attached to the housing such that it is intermediately positioned within the interior cavity of the housing;
    an upper surface of the baffle combined with the interior cavity of the housing generally defining a vapor re-circulation conduit; and
    a lower surface of the baffle and combined with the interior cavity of the housing generally defining a narrow gap cooling conduit;
  spraying coolant into an entrance of the cooling conduit; and
  recirculating at least part of vaporized coolant exiting the cooling conduit through the vapor re-circulation conduit and back into the entrance of the cooling conduit to increase heat transfer on the surface to be spray cooled toward the entrance side of the cooling conduit.

23. A method of reducing a pressure gradient across a surface to be evaporative spray cooled in a narrow gap enclosure, comprising:
  providing a housing with an interior cavity, the housing including:
    a baffle attached to the housing such that it is intermediately positioned within the interior cavity of the housing;
    an upper surface of the baffle combined with the interior cavity of the housing generally defining a vapor re-circulation conduit; and
    a lower surface of the baffle and combined with the interior cavity of the housing generally defining a narrow gap cooling conduit;
  spraying coolant into an entrance of the cooling conduit;
  recirculating at least part of vaporized coolant exiting the cooling conduit through the vapor re-circulation conduit and back into the entrance of the cooling conduit to increase pressure at the entrance of the cooling, and thereby reduce a pressure gradient through the coolant conduit.

24. A method of reducing a pressure gradient across a surface to be evaporative spray cooled in a narrow gap enclosure as recited in claim 23, and further wherein the baffle is thermally conductive and disposed to receive heat from the narrow gap cooling conduit and provide said heat to the vapor re-circulation conduit.

25. A method of reducing a pressure gradient across a surface to be evaporative spray cooled in a narrow gap enclosure as recited in claim 24, and further wherein the heat provided to the vapor re-circulation conduit is sufficient to cause further evaporation of liquid which may be present in the vapor re-circulation conduit.

26. A housing system for narrow gap evaporative spray cooling, comprised of the following:
  a housing means with an interior cavity;
  a baffle means attached to the housing means such that it is intermediately positioned within the interior cavity of the housing means,
    an upper surface of the baffle means combined with the interior cavity of the housing generally defining a vapor re-circulation conduit; and
    a lower surface of the baffle means combined with the interior cavity of the housing means generally defining a narrow gap cooling conduit;
  wherein the baffle means is thermally conductive and disposed to provide heat to the vapor re-circulation conduit.

* * * * *

UNITED STATES PATENT AND TRADEMARK OFFICE
CERTIFICATE OF CORRECTION

PATENT NO. : 7,104,078 B2  Page 1 of 1
APPLICATION NO. : 10/913299
DATED : September 12, 2006
INVENTOR(S) : Charles L. Tilton It is certified that error appears in the above-identified patent and that said Letters Patent is hereby corrected as shown below:

Column 7, line 37
Please replace "phase back through the re-circulation: conduit"
With -- phase back through the re-circulation conduit --

Column 13, line 15
Please replace "is about fifteen (15) m/s. for a constant"
With -- is about fifteen (15) m/s for a constant --

Column 15, line 7
Please delete "; a mixing zone in the internal cavity;"

Column 19, Claim 10, line 8
Please replace "a baffle with a upper surface"
With -- a baffle with a top surface --

Signed and Sealed this

Seventeenth Day of June, 2008

JON W. DUDAS
*Director of the United States Patent and Trademark Office*